(12) United States Patent
Bajaj

(10) Patent No.: US 12,417,144 B2
(45) Date of Patent: Sep. 16, 2025

(54) DATA RECOVERY FOR INACCESSIBLE MEMORY CELLS

(71) Applicant: MICROSOFT TECHNOLOGY LICENSING, LLC, Redmond, WA (US)

(72) Inventor: Harsh P Bajaj, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/335,802

(22) Filed: Jun. 15, 2023

(65) Prior Publication Data

US 2024/0419540 A1 Dec. 19, 2024

(51) Int. Cl.
*G06F 11/10* (2006.01)
*G06F 11/14* (2006.01)
*G06F 11/30* (2006.01)

(52) U.S. Cl.
CPC ...... *G06F 11/1068* (2013.01); *G06F 11/1435* (2013.01); *G06F 11/3058* (2013.01)

(58) Field of Classification Search
None
See application file for complete search history.

(56) References Cited

U.S. PATENT DOCUMENTS

| | | | |
|---|---|---|---|
| 9,570,159 B1 | 2/2017 | Wakchaure | |
| 9,679,661 B1 * | 6/2017 | Guo | G11C 16/08 |
| 2012/0198123 A1 * | 8/2012 | Post | G06F 11/1435 |
| | | | 711/E12.008 |

(Continued)

FOREIGN PATENT DOCUMENTS

| | | | | |
|---|---|---|---|---|
| WO | WO-0208900 A2 * | 1/2002 | .......... | G06F 11/1076 |
| WO | WO-2016030992 A1 * | 3/2016 | .......... | G06F 11/0727 |

(Continued)

OTHER PUBLICATIONS

"Data is in our DNA: Researchers Advance DNA as a Memory Material", Retrieved From: https://www.boisestate.edu/news/2021/04/22/data-is-in-our-dna-researchers-advance-dna-as-a-memory-material/, Apr. 22, 2021, 4 Pages.

(Continued)

*Primary Examiner* — Guerrier Merant
(74) *Attorney, Agent, or Firm* — SHOOK, HARDY & BACON L.L.P.

(57) ABSTRACT

Aspects of the embodiments disclosed herein include employing data stored on a first memory cell to recover lost data that cannot be retrieved from a second memory cell, for example, due to data loss or damage to the second memory cell. In one embodiment, the first memory cell and the second memory cell are part of the same computer memory assembly, such as the same SSD, and are directly linked to each other. In one embodiment, the first memory cell stores, among other things, a first special address location that references a location of the second memory cell and metadata of the second memory cell. In one embodiment, the first special address location is used to retrieve lost data from the second memory cell, thereby providing a computationally inexpensive technique for recovering lost data without the need for performing traditional computationally expensive backup operations across datacenters.

20 Claims, 14 Drawing Sheets

(56) References Cited

U.S. PATENT DOCUMENTS

| | | | | |
|---|---|---|---|---|
| 2014/0181579 A1* | 6/2014 | Whitehead | ............. | G06F 16/21 |
| | | | | 707/654 |
| 2018/0217930 A1* | 8/2018 | Koob | .................... | G06F 12/128 |
| 2019/0295630 A1* | 9/2019 | Lu | .................... | G11C 29/12015 |
| 2021/0390024 A1* | 12/2021 | Durham | .................. | G06F 21/79 |
| 2022/0171707 A1* | 6/2022 | Lee | ......................... | G06F 12/10 |
| 2022/0284978 A1 | 9/2022 | Kim | | |
| 2022/0300372 A1 | 9/2022 | Bert | | |
| 2023/0033539 A1* | 2/2023 | Xu | ..................... | G06F 11/1092 |

FOREIGN PATENT DOCUMENTS

| | | | | | |
|---|---|---|---|---|---|
| WO | WO-2016094025 A1 | * | 6/2016 | .......... | G06F 11/1474 |
| WO | WO-2020027911 A1 | * | 2/2020 | .......... | G06F 11/1076 |
| WO | WO-2020077283 A1 | * | 4/2020 | .......... | G06F 11/1044 |

OTHER PUBLICATIONS

"Data Loss Prevention Market Report 2023 (Global Edition)", Retrieved From: https://www.cognitivemarketresearch.com/data-loss-prevention-market-report, May 9, 2023, 10 Pages.

"How Computers Work: The CPU and Memory", Retrieved From: https://homepage.cs.uri.edu/faculty/wolfe/book/Readings/Reading04.htm, Retrieved on: Jan. 3, 2023, 6 Pages.

"Lessons Learned From 9/11: DNA Identification in Mass Fatality Incidents", Retrieved From: https://www.ojp.gov/pdffiles1/nij/214781.pdf, Sep. 2006, 142 Pages.

Emery, et al., "Reconstructing Full and Partial STR Profiles From Severely Burned Human Remains Using Comparative Ancient and Forensic DNA Extraction Techniques", In Journal of Forensic Science International: Genetics, vol. 46, May 2020, 8 Pages.

Heuring, et al., "Chapter 7—Memory System Design", Retrieved From: https://people.computing.clemson.edu/~mark/330/chap7.pdf, Feb. 2001, 81 Pages.

Kozyrakis, Christos, "Memory Design", Retrieved From: https://web.stanford.edu/class/archive/ee/ee108b/ee108b.1082/handouts/lect.11.Memory.pdf, Retrieved on: Jan. 3, 2023, 41 Pages.

Lonkov, et al., "DNA: The Ultimate Data-Storage Solution", Retrieved From: https://www.scientificamerican.com/article/dna-the-ultimate-data-storage-solution/#, May 28, 2021, 4 Pages.

Morizio, James, "Memory Design", Retrieved From: http://people.ee.duke.edu/~jmorizio/ece261/classlectures/Memory_design.pdf, Retrieved on: Jan. 3, 2023, 38 Pages.

Phillips, Gavin, "How to Securely Erase Your SSD Without Destroying It", Retrieved From: https://www.makeuseof.com/tag/securely-erase-ssd-without-destroying/, Apr. 28, 2022, 10 Pages.

International Search Report and Written Opinion received for PCT Application No. PCT/US2024/032183, Nov. 13, 2024, 12 pages.

* cited by examiner

DATA RECOVERY FOR INACCESSIBLE MEMORY CELLS

BACKGROUND

In the context of the storage of data for access by computer systems, what began as a large six-foot tall disk storage device was replaced by much smaller hard disk drives. In general, hard disk drives (HDDs) are traditional storage devices with spinning platters that read and write data. Whereas HDDs utilize mechanical spinning disks and moving read/write heads to access data, solid-state drives (SSDs) generally use memory chips storing information on flash memory cells, such as NAND (short for "not and") flash devices, without any mechanical spinning disks. As computing demand increased, those HDDs were later replaced by SSDs due to SSDs being even smaller, faster, quieter, and more durable than HDDs. Moreover, the growth of cloud computing technology has led to the more widespread adoption of many computer memory assemblies, such as SSDs, in certain datacenters. In certain contexts, SSDs have been favored over HDDs for their efficient storage, leading to a recent increased amount of storage occurring on SSDs. Increased efforts have been made to preserve and save data to ensure their continued access despite outages in datacenters.

SUMMARY

Various aspects of the technology described herein are generally directed to systems, methods, and computer storage media for, among other things, using data from a first memory cell sequentially linked to a second memory cell to facilitate recovery of lost data from the second memory cell. By employing aspect of the embodiments disclosed herein, a plurality of memory cells are sequentially linked to each other so that an inaccessible portion of a memory cell from which data cannot be read, for example, due to damage or to the memory cell, can be recovered based on data stored on a memory cell sequentially liked to the inaccessible memory cell.

Typically, certain datacenters are built with certain redundancies, such as backup storages across different datacenter locations, to avoid instances of data loss. For example, a data outage due to damage to a first computer memory assembly of a first datacenter can be remedied by a second computer memory assembly of a second datacenter that serves as a redundant backup to the first datacenter. In this example, the second computer memory assembly serves as a backup device storing identical copies of data stored in the first computer memory assembly. However, if both the first computer memory assembly and the second computer memory assembly become damaged, permanent data loss may result. Accordingly, certain datacenters fail to efficiently implement mechanisms for reducing or avoiding data loss outside of the context of backing up data across datacenters.

To remedy these and other issues, aspects of the embodiments disclosed herein include employing data stored on a first memory cell to recover lost data that cannot be retrieved from a second memory cell, for example, due to data loss or damage to the second memory cell. In one embodiment, the first memory cell and the second memory cell are part of the same computer memory assembly, such as the same SSD, and are directly linked to each other. In one embodiment, the first memory cell stores, among other things, a first special address location that references a location of the second memory cell and metadata of the second memory cell. The first special address location can be stored in a small piece of memory, referred to herein, in one example, as a "miniscule:" no more than a few bits in size. Embodiments of the first special address location include a plurality of logic gates, such as an AND gate, an exclusive or (XOR) gate, or a NOT gate, that references the location and metadata of the directly linked second memory cell. In one embodiment, these logic gates are used to restore the lost data. Accordingly, the first memory cell can store, in a miniscule, the first special address location that references a location and metadata of the second memory cell and that can be used to retrieve lost data from the second memory cell.

Accordingly, embodiments of this disclosure at least partially remedy the technical shortcomings of traditional redundancies across data centers, which often utilize large storage space within hardware, such as backup storage devices, to store the backup copies. Additionally, performing a backup operation, whereby data from one datacenter containing the backup storage device is copied over to another datacenter, is a slow, computationally expensive process that often requires large amounts of computational resources and network bandwidth to accomplish. Instead, certain embodiments disclosed herein offer a local, software-based, alternative solution that does not consume network bandwidth since the operations are locally performed within or near a computer memory assembly with certain computationally inexpensive operations compared to the conventional backup operations performed across datacenters. Moreover, even if both the backup storage device and the corresponding memory cell lose their data, certain embodiments disclosed herein provide a solution for retrieving the lost data.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The technology described herein is described in detail below with reference to the attached drawing figures, wherein.

DETAILED DESCRIPTION OF THE INVENTION

Figure 1A:
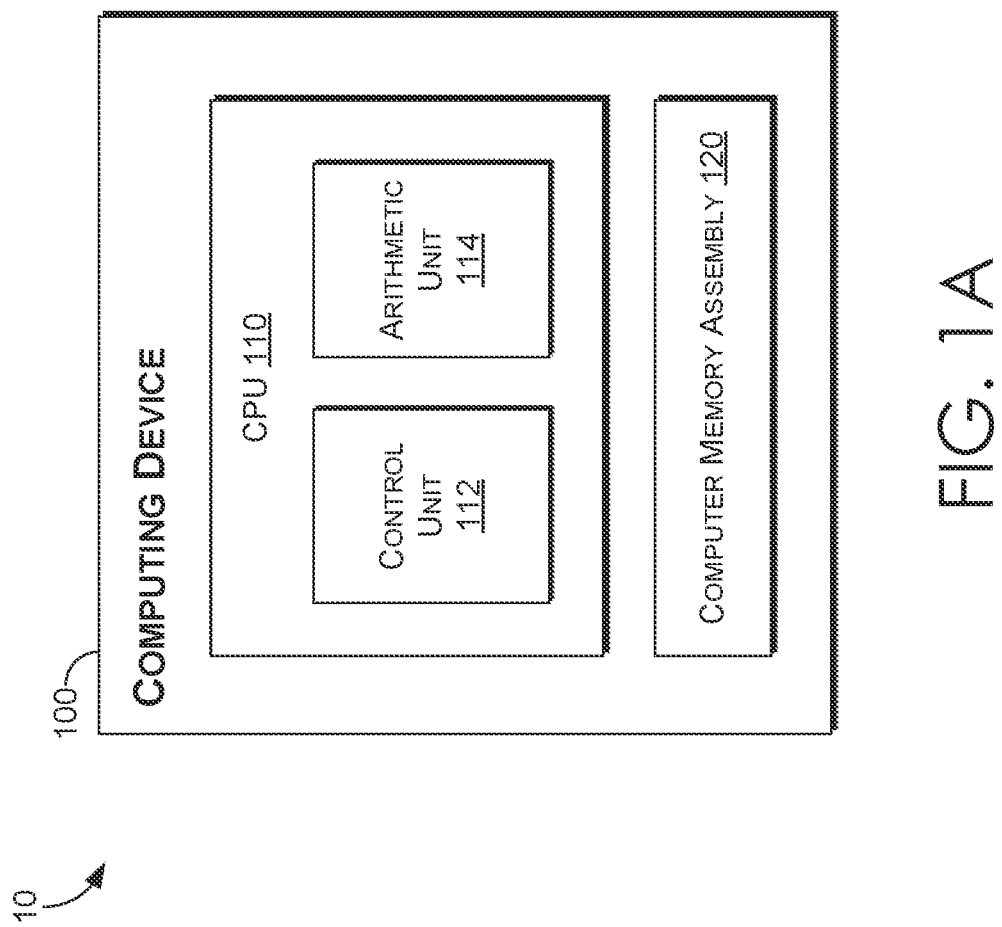
FIG. 1A depicts a block diagram of an example computing device suitable for use in implementing aspects of the technology described herein.

Increased efforts have been made to preserve and save data to avoid data loss in datacenters. To attempt to avoid data loss, certain datacenters include redundancies, such as backup storages across different datacenter locations, to avoid instances of data loss. For example, data loss in a first datacenter due to damage to a first computer memory assembly of the first datacenter may be remedied by a second computer memory assembly of a second datacenter that serves as a redundant backup to the first datacenter. In this example, the second computer memory assembly serves as a backup device storing identical copies of data stored in the first computer memory assembly. Indeed, certain traditional backup systems employ redundancies stored across different data centers. When these traditional backup systems perform a backup operation, data from one datacenter containing the backup storage device is copied over to another datacenter that cannot access particular data. This process is slow, computationally expensive, and often requires large amounts of computational resources and network bandwidth, which results in overload that affects other systems in a distributed network.

One possible solution would be to duplicate these backup storages across many datacenters so that hopefully at least one backup storage contains the data in instances where the rest of the backup storages lose the data. However, such a solution requires various hardware level investments, which are costly and difficult to scale in light of chip shortages and other limitations. Additionally, this solution fails to reduce the computational expenses or remedy the network bandwidth congestion associated with copying data from one datacenter containing the backup storage device to another datacenter that cannot access particular data. Accordingly, conventional systems and techniques for avoiding data loss suffer from certain limitations, the improvements of which can be difficult to achieve and develop in practice.

With this in mind, embodiments of the present disclosure include modifying a computer memory assembly to configure memory cells of the computer memory assembly with data sequentially linking the memory cells to each other. In this manner, the data linked between a plurality of memory cells is accessed and processed by a processor to facilitate recovery of lost data from a memory cell from which data is unreadable due to destruction or device deterioration. In one example, "lost data" refers to data that was previously stored on a memory device, but it inaccessible due to damage to or normal wear and use of a memory device storing the now "lost data." Embodiments of the data linked between a plurality of local memory cells allow for recovery of lost data from a subsequent device without relying on backup storage that stores an identical copy of the data originally stored in the inaccessible computing device. In one example, the "linked data" or "data linked" between the memory cells refers to information stored on a first memory cell and that relates to a second memory cell that is directly and sequentially coupled to the second memory device. Example "linked data" is stored on a miniscule of the first memory cell and includes a first special address location referencing a location of the second memory cell (that is sequentially linked to the first memory device) and metadata of the second memory cell. In this manner, the first special address location can be read from the first memory cell to initiate and perform recovery of the portion of the second memory cell that is inaccessible to recover lost data originally stored on the second memory device, for example, at the inaccessible portion of the second memory device, as discussed herein.

In more detail, embodiments of the present disclosure include establishing communication with the computer memory assembly. As used herein in one example, a "computer memory assembly" refers to a hardware device that includes a plurality of memory cells or memory devices, such as those discussed in FIGS. 1A, 1B, and 9. An example computer memory assembly is a solid-state drive, such as that illustrated in FIG. 1B. In this example, the computer memory cells of the computer memory assembly include NAND flash devices. However, embodiments of the present disclosure are not limited to SSDs, and can include any of the memory cells, such as the memory devices discussed in FIG. 8, for example.

Subsequent to establishing the communication, embodiments of the present disclosure include determining that at least a portion of the second memory cell is inaccessible. In one example, "an inaccessible portion" of a memory cell refers to a subset of the memory cell from which data cannot be accessed or read by a processor for any number of reasons, including deterioration of a memory cell, damage to the memory cell, data loss experienced by the memory cell, or any other accidental or unauthorized reasons for data loss. In one embodiment, when a processor cannot read data that has not been manually deleted by a user from a portion of the memory cell, the lost data is automatically recovered by performing a recovery operation, such as that discussed in the context of recovery engine 350.

Additionally, embodiments of the present disclosure include accessing, from the first memory cell, the first special address location referencing the location of the second memory cell and the metadata of the second memory cell. In one embodiment, the first special address is stored in a "miniscule," which in one example, refers to a small portion of memory, no more than a few bits, that stores information about a sequentially linked memory cell. In one embodiment, the first special address location contains data indicative of the location of the second memory cell and data indicative of the metadata of the second memory cell. In one embodiment, at least one of (1) the data indicative of the location of the second memory cell or (2) data indicative of the metadata of the second memory cell is smaller than the most significant bits (MSB) employed by traditional cache tags, thereby improving computational efficiency in employing the special address location.

Additionally, embodiments of the present disclosure include determining lost data that was stored in the second memory cell based on the location of the second memory cell and the metadata of the second memory cell. As discussed in the context of the recovery engine 350 of FIG. 3, a processor can determine the lost data that was stored in the second memory cell based on data, such as the first special address location contained in the first memory cell. Embodiments of the present disclosure determine the lost data previously stored in the second memory cell by performing an XOR-based algorithm, which includes, for example, generating, based on the first special address location, a generator matrix and a parity check matrix; simulating scatter sector loss and reconstruction based on the generator matrix and the parity check matrix; constructing a pseudo-inverse matrix based on the generator matrix and the parity check matrix; and determining parity bits or the lost data based on at least one of the pseudo-inverse matrix, the generator matrix, or the parity check matrix. Thereafter, the lost data determined to be stored in the second memory cell can be restored by storing the lost data to a memory cell. In one embodiment, the lost data determined to be stored in the second memory cell is recovered based on the determined parity bits, such that the parity bits are added to the memory cell.

In this manner, embodiments of the present disclosure offer a local, software-based alternative solution that does not consume high network bandwidth since operations can be locally performed within or near a computer memory assembly with computationally inexpensive operations compared to the conventional backup operations performed across datacenters. Accordingly, embodiments of the present disclosure at least partially remedy the technical shortcomings of traditional redundancies, such as backups, in data centers, which often require hardware, such as backup storage devices, to store the backup copies. Additionally, performing a backup operation, whereby data from one datacenter containing the backup storage device is copied over to another datacenter, is a slow, computationally expensive process that often requires large amounts of computational resources and network bandwidth to accomplish.

Aspects of the technical solution can be described by way of examples and with reference to the figures. FIG. 1A illustrates an example system 10 that includes a computing device 100 suitable for use in implementing aspects of the technology described herein. As illustrated, the example computing device 100 includes a central processing unit (CPU) 110 that includes a control unit 112 and an arithmetic unit 114; the example computing device 100 also includes a computer memory assembly 120.

Embodiments of the control unit 112 of the CPU 110 include circuitry that uses electrical signals to direct the entire computing device 100 to execute stored program instructions. In one example, the control unit 112 does not directly execute program instructions; rather, the control unit 112 directs other parts of the system to do so. Embodiments of the control unit 112 communicate with both the arithmetic unit 114 and the computer memory assembly 120.

Figure 3:
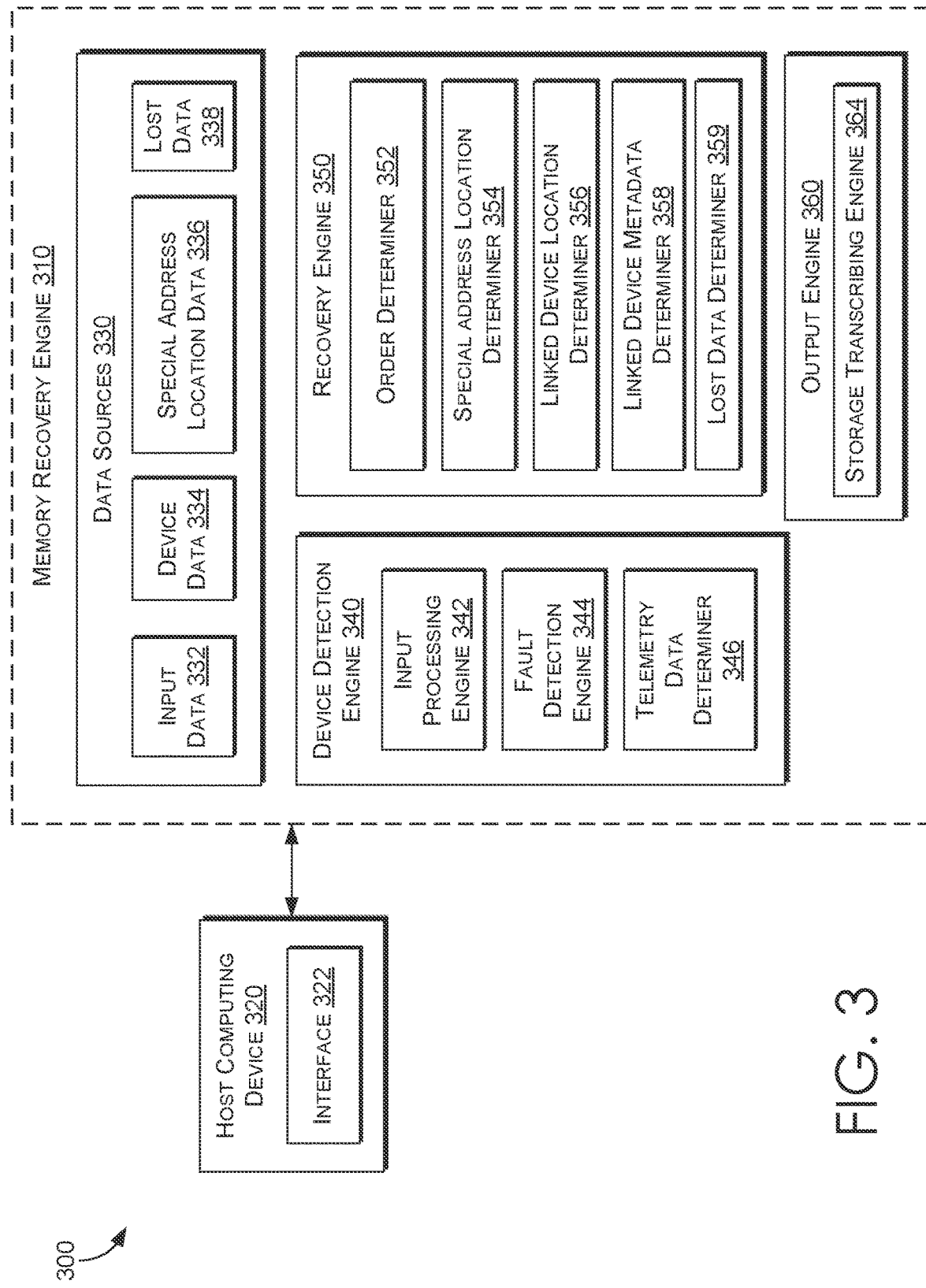
FIG. 3 depicts a block diagram of an example memory recovery system employing a memory recovery engine to programmatically recover lost data from a deteriorating or damaged memory cell, in accordance with aspects of the technology described herein.

Embodiments of the arithmetic unit 114 include the electronic circuitry that executes arithmetic and logical operations, such as those discussed herein, for example, by system 300 of FIG. 3. In some embodiments, the arithmetic unit 114 performs any number of arithmetic operations, or mathematical calculations, such as addition, subtraction, multiplication, and division. Additionally, in some embodiments, the arithmetic unit 114 also performs logical operations, such as comparisons of any data elements such as numbers, letters, or special characters, to name a few. Other logical operations that can be performed by the arithmetic unit 114 include, among others, equal to operations, less than operations, greater than operations, less than or equal to operations, greater than or equal to operations, and not equal operations. Thereafter, the computing device 100 can then take action based on the result of the comparison. In some embodiments, after performing a comparison operation, the computing device 100 is able to perform the restoration and other operations discussed herein.

Embodiments of computer memory assembly 120 include at least one of: primary storage (also referred to in one example as "main memory") and secondary storage. The CPU 110 interacts with primary storage referring to it for both instructions and data. In the context of primary storage, embodiments of the computer memory assembly 120 hold data only temporarily while the computing device 100 executes computer-readable instructions as part of executing a program. In the context of secondary storage, embodiments of the computer memory assembly 120 hold permanent or semi-permanent data on some external magnetic or optical medium, for example. In some embodiments, the computer memory assembly 120 corresponds to an SSD that includes any number of components, such as an SSD controller, a dynamic random-access memory (DRAM), a NAND flash device, and the like.

Figure 1B:
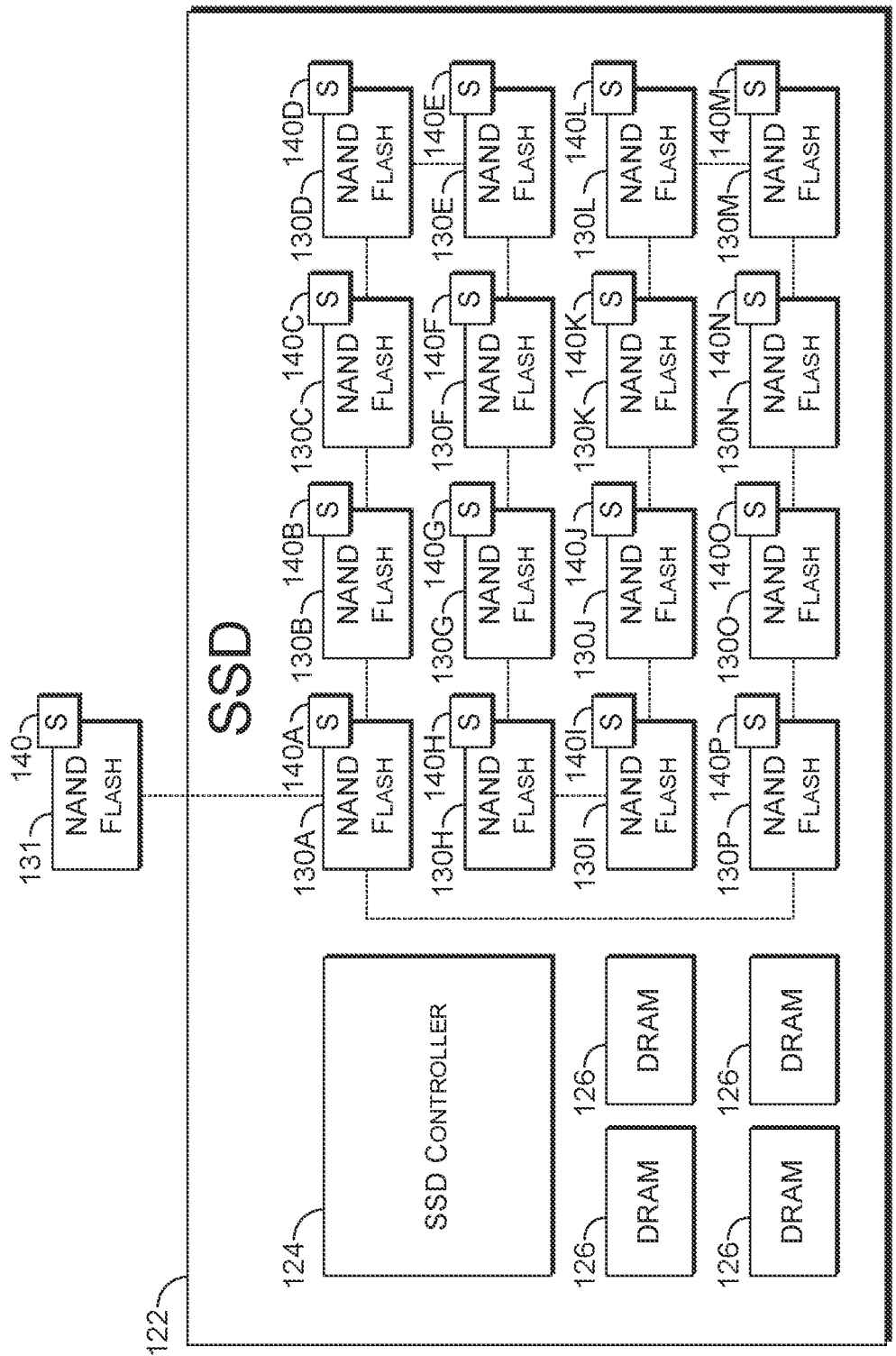
FIG. 1B depicts a block diagram of an example computing device that includes a solid-state drive (SSD) comprising a plurality of sequentially linked NOT and (NAND) flash devices, in accordance with aspects of the technology described herein.

To further help illustrate, FIG. 1B illustrates an example solid-state drive (SSD) 122 having an SSD controller 124, at least one DRAM 126, and at least one NAND flash device 130. In the illustrated example, the SSD 122 includes one SSD controller 124, four DRAMs 126, and sixteen NAND flash devices 130, specifically, NAND flash devices 130A, 130B, 130C, 130D, 130D, 130E, 130F, 130G, 130H, 130I, 130J, 130K, 130L, 130M, 130N, 130O, and 130P. In some embodiments, the NAND flash devices 130 are connected in parallel to the SSD controller 124 to scale bandwidth and reduce or hide latencies, for example, so long as enough outstanding operations are pending and the load is evenly distributed between the NAND flash devices 130.

In some embodiments, the SSD 122 is modular such that its components can be replaced by other components, can be removed, and/or other components can be added. Additionally, the SSD 122 can be communicatively coupled to other SSDs to scale and distribute workloads. In some embodiments, the SSD 122 is communicatively coupled to a host computing device (such as CPU 110 of FIG. 1A) that directs computer operations to the SSD 122. Example SSDs include those manufactured or configured by enterprises associated with ATP®, INTEL®, KIOXIA®, MICRON®, NVIDIA®, and SAMSUNG ELECTRONICS®, among many others.

Embodiments of the SSD controller 124 communicatively, electronically, and programmatically couple the components of the SSD 122, such as the illustrated DRAMs 126 and NAND flash devices 130 to a host computing device. An example host computing device includes the computing device 1000 and/or associated components of FIG. 10, as well as the CPU 110 of FIG. 1A. In one embodiment, the SSD controller 124 is an embedded processor that executes firmware-level code to perform any number of functions. For example, the SSD controller 124 performs bad block mapping, read and write caching, encryption, crypto-shredding, error detection and correction (for example, via error correcting code [ECC] such as BCH code), garbage collection, read scrubbing management, read disturb management, and wear leveling, to name a few.

In one example, DRAM 126 refers to a random-access semiconductor memory that stores each bit of data in a memory cell, usually consisting of a small capacitor and a transistor. In some embodiments, DRAM 126 accesses data, generally in less than 10 microseconds, and is used to accelerate applications that would otherwise be held back by the latency of flash SSDs or traditional HDDs. One of the largest applications for DRAM 126 is the main memory (colloquially called the random-access memory "RAM") in certain computers and graphics cards (where the "main memory" is referred to as the graphics memory). DRAMs 126 can also be used in many portable devices and video game consoles. In some embodiments, DRAMs 126 incorporate either an internal battery or an external AC/DC adapter and backup storage system to ensure data persistence while no power is being supplied to the drive from external sources. For example, if power is lost, the battery provides power while information is copied from random access memory (RAM) to backup storage. When the power is restored, the information is copied back to the RAM from the backup storage, and the SSD resumes normal operation (similar to the hibernate function used in modern operating systems). The embodiments described herein provide a solution by reducing a system's dependence on backup storage for data restoration.

In some embodiments, the NAND flash device 130 includes a non-volatile flash memory capable of holding data even when the NAND flash device 130 is not connected to a power source. In one embodiment, the NAND flash device 130 includes a metal-oxide-semiconductor (MOS) integrated circuit chip that includes non-volatile floating-gate memory cells. In one embodiment, the NAND flash device 130 is packaged in standard disk drive form factors, such as 1.8-, 2.5-, and 3.5-inch form factors. However, small form factors, such as the M.2 form factor, are possible.

As illustrated by the dashed lines, in some embodiments, the NAND flash devices 130 are sequentially linked to each other. Take the first NAND flash device 130A and the second NAND flash device 130B as an example. In this example, the first NAND flash device 130A stores, in a miniscule, a first special address location that references a location of the second memory cell and metadata of the second memory cell. As discussed with respect to FIGS. 2A, 2B, and 2C, in some embodiments, the first special address location includes a plurality of logic gates, such as an AND gate or a NOT gate, that reference the location and metadata of the directly linked second NAND flash device 130A. That is, the first NAND flash device 130A can store location information and corresponding metadata about the second NAND flash device 130B to be used (for example, by the SSD controller 124) to recover data from the second NAND flash device 130B in the case that the second NAND flash device 130B becomes inaccessible due to loss of data or damage, for example.

Although this example is discussed in the context of the NAND flash devices 130 being linked to each other within the SSD 122, it should be understood that an external NAND flash device 131 can be linked to a NAND flash device 130A of the SSD 122. Moreover, although the special address location is discussed in the context of storing information about a subsequent memory cell, such as the first NAND flash device 130A storing information about the second NAND flash device 130B, certain memory cells can alternatively or additionally store information about a preceding memory cell. For example, the second NAND flash device 130B can store in a corresponding special address location information about the first NAND flash device 130A (in this example, a preceding memory cell), as well as or alternative to, information about the third NAND flash device 130C. As discussed above, the special address location can reference a location and metadata of the linked memory cell (in this example, the first NAND flash device 130A or the third NAND flash device 130C).

To improve read/write speed, embodiments of the SSD controller 124 can employ an architecture that includes data striping and interleaving. As mention herein, performance of the SSD 122 can scale through the parallel coupling of the NAND flash devices 130 to the SSD controller 124. For example, a single NAND flash device 130 is relatively slow due to the narrow (8/16 bit) asynchronous I/O interface and the high latency of basic I/O operations. By way of non-limiting examples, it can take about 25 microseconds (μs) for the single NAND flash device 130 to fetch a 4 kilobyte (KiB) page from an array to an I/O buffer on a read operation. Furthermore, it can take about 250 μs to commit a 4 KiB page from the I/O buffer to the array on a write operation, and it takes about 2 milliseconds (ms) to erase a 256 KiB block. When multiple NAND flash devices 130 operate in parallel inside an SSD, the bandwidth scales and the high latencies can be hidden as long as enough outstanding operations are pending and the load is evenly distributed between devices.

As illustrated, the example NAND flash devices 130a-130p include a sensor assembly 140a-140p, respectively. In one embodiment, the sensor assembly 140 includes any suitable sensor that provides signals indicative of information useful in determining the health of the corresponding NAND flash device 130. For example, the sensor assembly 140 includes a telemetry sensor that provides signals indicative of telemetry information, such as temperature or power consumption, to name a few. In some embodiments, the telemetry information from sensor assembly 140 is plotted over time to determine a health of the NAND flash device 130. In one embodiment, telemetry information outside an acceptable range is correlated with damage to the corresponding NAND flash device 130. In this manner, corresponding NAND flash devices 130 can be serviced or replaced prior to damage. However, in instances of data loss by a NAND flash device 130, the embodiments disclosed herein facilitate data recovery.

Figure 2A:
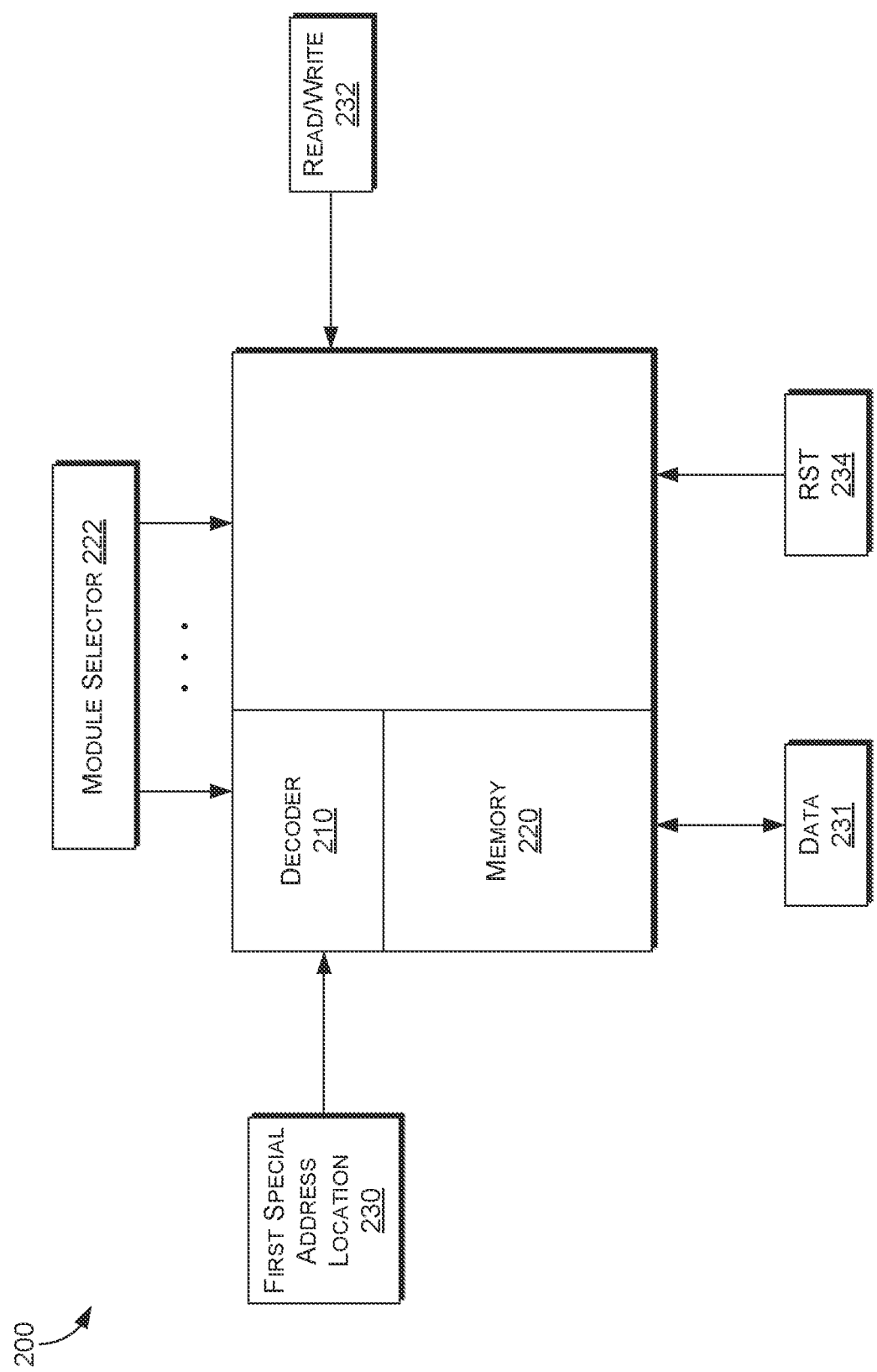
FIG. 2A depicts a block diagram of an example logic diagram implemented by a computing device, in accordance with aspects of the technology described herein.

Turning to FIG. 2A, depicted is a block diagram of an example logic diagram implemented by a computing device, such as an SSD 122 (FIG. 1B), in accordance with aspects of the technology described herein. In one example, the logic diagram 200 includes components that are included in any component of the SSD 122 or the computing device of FIG. 9. As illustrated, the example logic diagram 200 includes a decoder 210 and memory 220. The memory 220 can include short-term memory or long-term memory, as discussed herein with respect to the computer memory assembly 120 of FIG. 1A and the memory of the computing device of FIG. 10.

In one embodiment, the decoder 210 is a binary decoder that has two or more inputs for address bits and one or more outputs for device selection signals. A dedicated, single-output address decoder may be incorporated into each device (for example, each DRAM 126 or each NAND flash device 130 of FIG. 1B) on an address bus, or a single address decoder may serve multiple devices (for example, can serve at least two DRAMs 126 and/or at least two NAND flash devices 130 of FIG. 1B). In the context of address decoders, address decoders can be used in conjunction with buses, such as those in Field Programmable Gate Arrays (FPGAs) and Application-Specific Integrated Circuits (ASICs), for example.

In one example, when the address for a particular device appears on the address inputs, the decoder 210 asserts the selection output for that device based on logic from the module selector 222. For example, in the illustrated embodiment, the decoder 210 receives an indication of a special address location 230. As discussed herein, in one example, the special address location 230 comprises a reference to a location of a subsequent memory cell and to metadata of a subsequent memory cell. After receiving the indication of the special address location 230, the module selector 222 identifies the location of the subsequent memory cell and the metadata associated with that location. The location or the metadata can be determined, and operations to recover the lost data can be initiated, as discussed in the context of the recovery engine 350 of FIG. 3.

Thereafter, a read/write operation 232 can be executed to cause the corresponding lost data 231 to be determined and written to the memory 220. In one embodiment, the recovery operation comprises executing a writing operation 232 against the memory 220 to cause the lost data determined to be stored in the second memory cell to be recovered. In one embodiment, executing the writing operation 232 includes writing the lost data 231 determined from an inaccessible portion of memory. To facilitate recovering the lost data 231, embodiments of the logic diagram 200 include an INTEL® Rapid Storage Technology (RST) 234 that provides lower power consumption protection against data loss. For example, the RST 234 provides data redundancy to copy data from a first memory cell to a second memory cell. In one embodiment, the RST 234 allows two RAID (Redundant Array of Independent Disks) volumes to be created on a single array, such that the first volume occupies part of the array, leaving space for the second volume. Example arrays can include two to six SATA (Serial Advanced Technology Attachment) disks depending on the volume types. In some embodiments, the RST 234 provides heightened security features, such as password protection, to protect against unauthorized access to the recovered data.

Figure 2B:
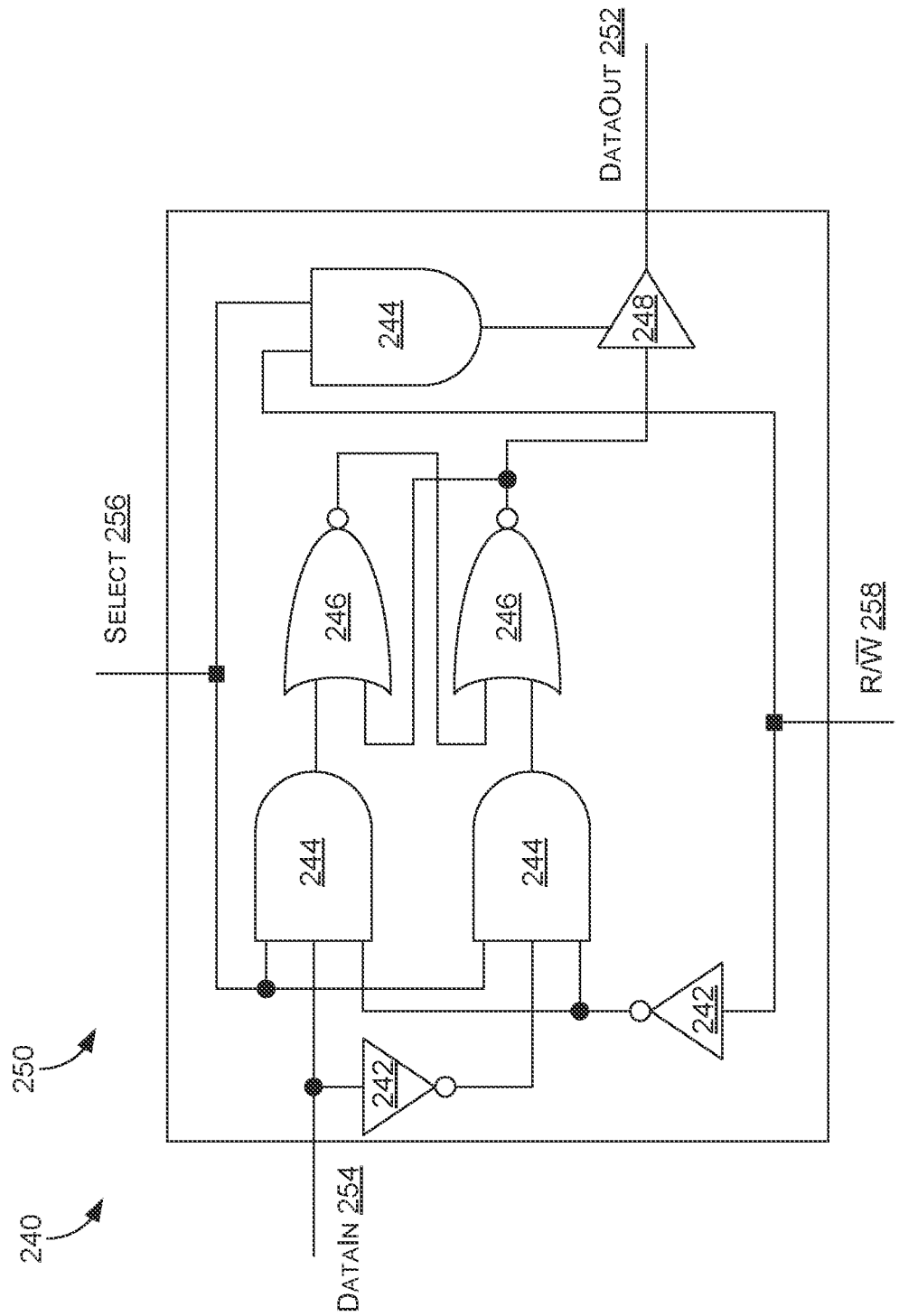
FIG. 2B depicts a schematic diagram of an example logic diagram implemented by a computing device, in accordance with aspects of the technology described herein.

FIG. 2B depicts a schematic diagram of an example logic diagram 240 corresponding to aspects implemented by a computing device, such as a component of the SSD 122 (FIG. 1B), in accordance with aspects of the technology described herein. In one example, the example logic diagram 240 corresponds to one DRAM 126 or one NAND flash device 130. Embodiments of the example logic diagram 240 include any number of NOT logic gates 242, AND logic gates 244, not or (NOR) logic gates 246, and YES logic gates 248, as well as any other suitable gates (such as XOR gates). For example, the illustrated logic diagram 240 includes three NOT logic gates 242, three AND logic gates 244, two NOR logic gates 246, and one YES logic gate 248.

In one embodiment, the logic diagram 240 corresponds to a binary cell 250 that can be incorporated into a component of the SSD 122 as an RS flip-flop used to remember at least one bit of data. In one example, "RS" refers to set/reset, such that the flip-flop can be reset back to its original state based on a RESET input and an output, Q, that will be either at logic level "1" or logic "0," for example, based on the set/reset condition of the flip-flop. In one example, a "binary cell" refers to a memory that is triggered based on the flip-flop. For example, when such a binary cell 250 is selected and in "read" mode, the current value of its underlying flip-flop will be transferred to the cell's output line 252. When the cell is selected and in "write" mode, an input data signal 254 will determine the value remembered by the flip-flop. The illustrated binary cell 250 includes three inputs and a single output 252. The illustrated three inputs are Data input 254, Select input 256, and Read/write input 258. In one embodiment, the flip-flop performs a storage operation to store at least one of the metadata or the location of the sequentially linked device, as discussed herein.

In some embodiments, the select input 256 is used to access the binary cell 250, either for reading or writing. For example, when the select input 256 is high, "1," then a memory operation is performed on this binary cell 250. Alternatively, when the select input 256 of the binary cell is low, "0," then the contents of the cell will not be read from or written to. As illustrated, the select input 256 are routed to the AND logic gates 244 and that select input 256 is one of the inputs to each of these gates. Thus, in embodiments where the select input 256 is low, the inputs to the RS flip-flop will stay low, meaning that its stored value will not change, and the output produced by the cell will be low (regardless of whether the actual bit held in the flip-flop is "0" or "1").

In some embodiments, the read/write input 258 is controlled. In one embodiment, a low, or "0", input for the read/write input 258 signifies "read," while a high, "1", the read/write input 258, signifies "write." In one embodiment, during the read phase, the read/write input 258 will not write to the binary cell 250. Likewise, in one embodiment, during the write phase, the read/write input 258 will not read the contents of the binary cell 250.

By way of non-limiting example, suppose the cell has been selected; for example, the select input 256 is high, signifying that a memory access operation is to be performed on this cell. Furthermore, suppose that the clock value on the "read/write" line is low (causing the "negated read/write" to be high), indicating that the cell contents are to be read. In this example, the value output by the cell depends on the Q value of the flip-flop. If Q is low, the cell outputs a "0." If Q is high, the cell outputs a "1." For example, this is the output because the AND logic gate 244 attached to the cell's output line has three inputs; specifically, the select input 256, a negated read/write input 258, and Q, such that both the select input 256 and the negated read/write input 258 are high.

As mentioned earlier, when the cell is being read, its contents cannot be modified because the same low value on the "read/write" input 258 that allows the cell to be read is fed into the AND logic gates 244, which guard the inputs to the flip-flop. Thus, in this example, the inputs to R and S are low during reads, thereby preventing the value of the flip-flop from being modified.

Alternatively, in examples, when the cell is selected and the read/write input 258 is set to high, signifying a "write" operation, the value placed into the cell will depend solely on the data input 254. This is at least due to the AND logic gates 244 that guard the R and S inputs of the flip-flop, both having two of their inputs set high. In this example, those two inputs are the select input 256 and the read/write input 258. Thus, if the data input 254 is high, S (set) will receive a high and the flip-flop will store a "1." If, on the other hand, "Input" is low, then R (reset), which receives a negated version of "Input," will go high and the flip-flop will reset to "0." In some embodiments, having a negated version of the input line run into R prevents the RS flip-flop from ever entering into its invalid state. In this manner, a special address location can be used to communicate location and metadata about a subsequent device via logic similar to that of example logic diagram 240.

Figure 2C:
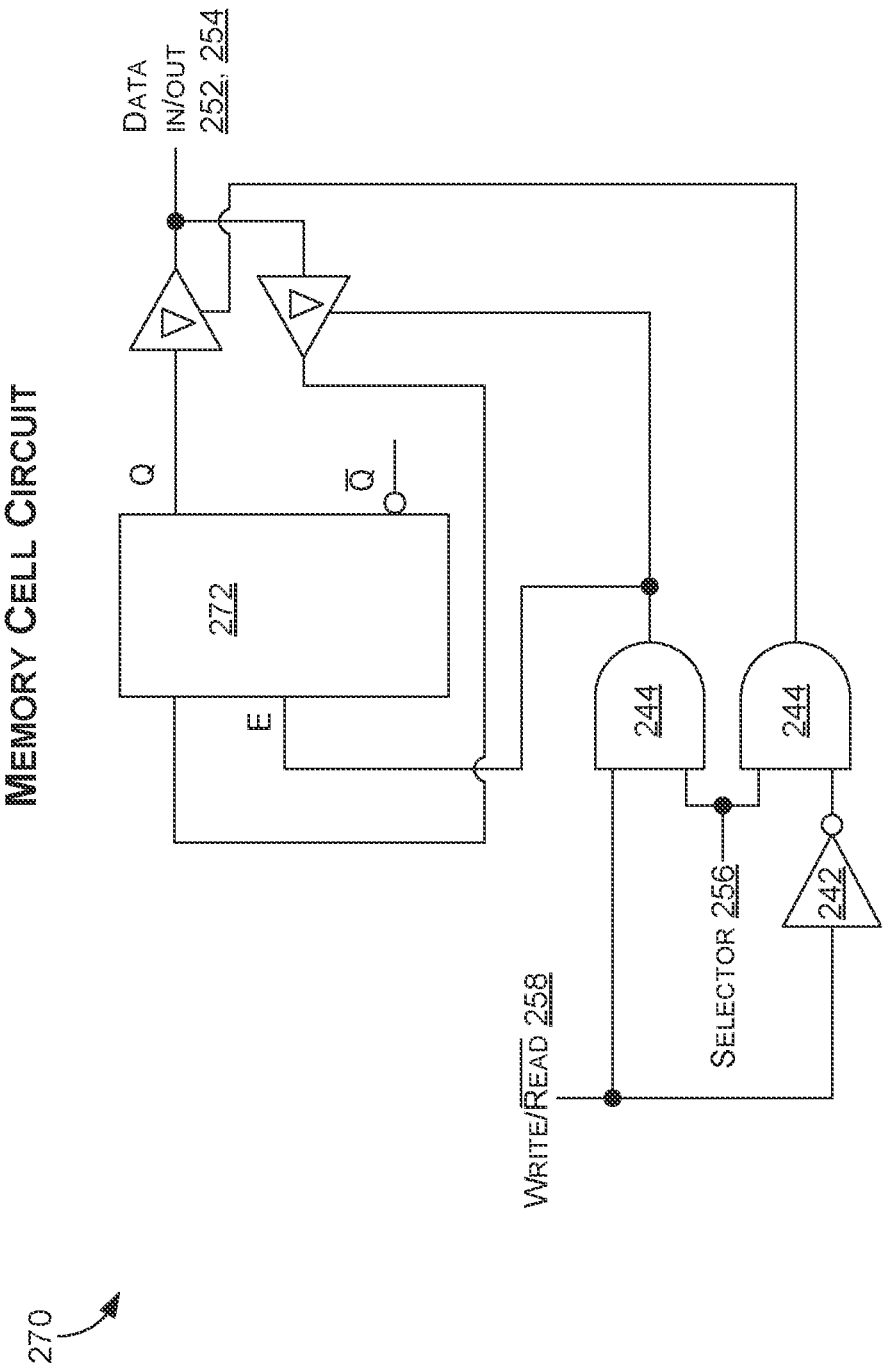
FIG. 2C depicts a block diagram of an example logic diagram implemented by a computing device, in accordance with aspects of the technology described herein.

Turning to FIG. 2C, depicted is a block diagram of an example logic diagram 270 corresponding to aspects implemented by a computing device, such as a component of the SSD 122 (FIG. 1B), in accordance with aspects of the technology described herein. In one example, the example logic diagram 270 corresponds to one DRAM 126 or one NAND flash device 130. Embodiments of the example logic diagram 270 include any number of logic gates, such as NOT logic gates 242, AND logic gates 244, NOR logic gates, and YES logic gates. Similar to the example logic diagram 240 from FIG. 2B, the logic diagram 270 includes a data input 254, a select input 256, a read/write input 258, and a data output 252. In one embodiment, a flip-flop 272 performs a storage operation to store at least one of the metadata or the location of the sequentially linked device, as discussed herein. In this manner, a special address location can be used to communicate location and metadata about a subsequent device via logic similar to that of example logic diagram 270.

Figure 2D:
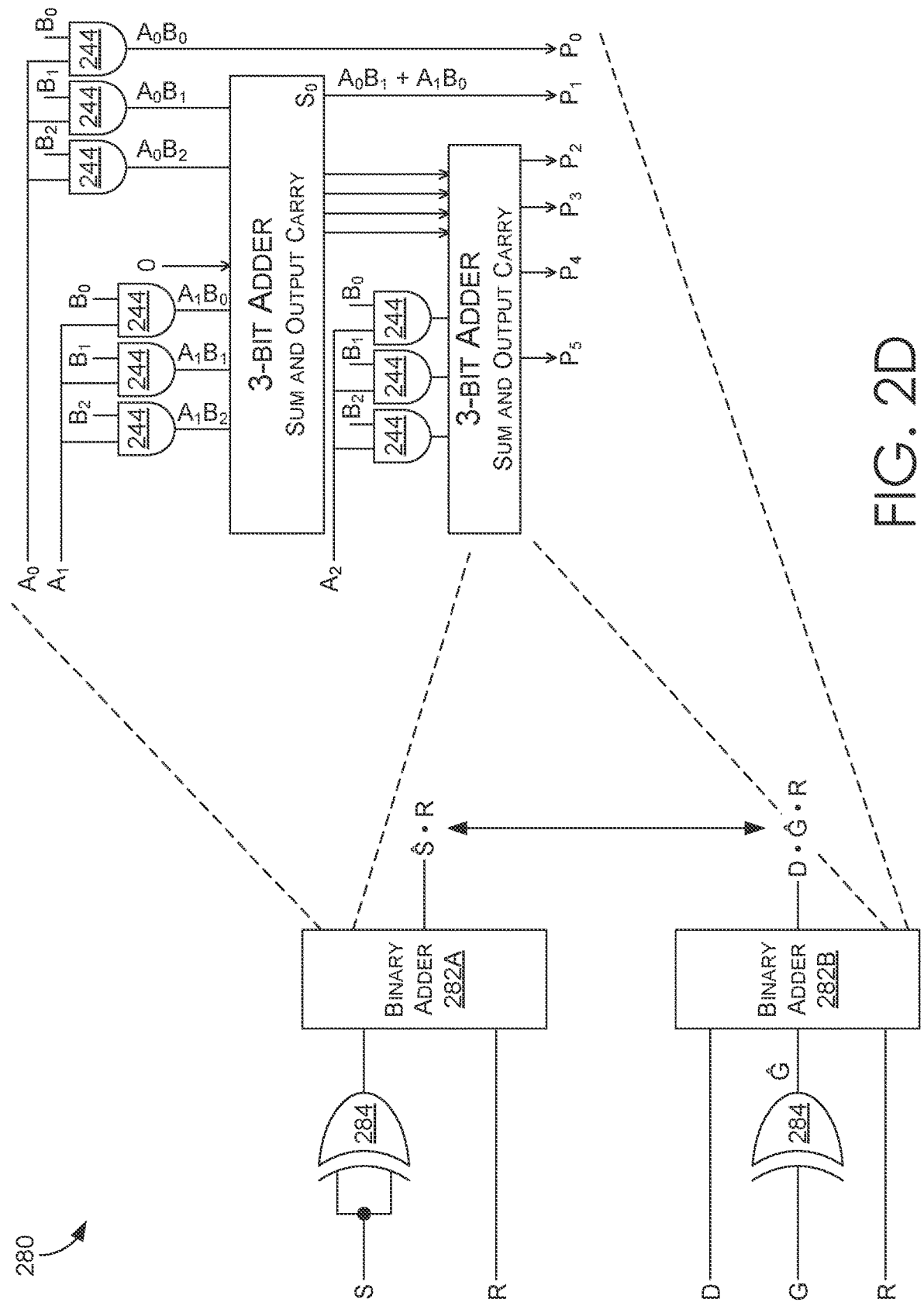
FIG. 2D depicts a block diagram of an example logic diagram implemented by a computing device, in accordance with aspects of the technology described herein.

Turning to FIG. 2D, depicted is a block diagram of an example logic diagram 280 corresponding to aspects implemented by a computing device, such as a component of the SSD 122 (FIG. 1B), in accordance with aspects of the technology described herein. In one example, the example logic diagram 280 is configured to implement the embodiments of the lost data determiner 359, such as the XOR-based algorithm. As illustrated in the example logic diagram 280, a first binary adder 282A receives S, a row vector of data and parity elements stored on disks, via an XOR logic gate 284. In one example, an XOR logic gate 284 is a digital logic gate that gives a true (1 or HIGH) output when the number of true inputs is odd. In one example, the XOR logic gate 284 implements an exclusive disjunction from mathematical logic, such that a true output results if one, and only one, of the inputs to the gate is true.

Additionally, the first binary adder 282A receives R, which is a pseudo inverse of $\hat{G}$, which is in one example a version of a generator matrix, G, with zeroed columns corresponding to the failed sectors detected in a stripe, as set forth below. As illustrated, a second binary adder 282B receives D, which is a row vector of input user data values. Additionally, the second binary adder 282B receives $\hat{G}$ from an XOR logic gate 284 that determines $\hat{G}$ from G. Additionally, the second binary adder 282B receives R.

As illustrated, the first and/or second binary adder 282A and 282B includes an assembly of AND gates 244 arranged in any suitable arrangement. Although the illustrated binary adder 282 includes a three-bit adder, any suitable adder (such as a four-bit, eight-bit, sixteen-bit, and the like) is contemplated. In one embodiment, the output of the example logic diagram 280 corresponds to the values discussed below with respect to equation (7). Accordingly, the example logic diagram 280 can be used to determine, from a neighboring memory cell, lost data from an unavailable memory cell that is sequentially linked to the neighboring memory cell, as discussed herein. For example and as illustrated in FIG. 1B, lost data from the first NAND flash 130A can be determined from any sequentially linked NAND flash device, such as NAND flash 131, NAND flash 130B, or NAND flash 130P.

Aspects of the technical solution can be described by way of examples and with reference to FIG. 3. FIG. 3 is an example memory recovery system 300 employing a memory recovery engine 310 to programmatically recover lost data from a memory cell that is inaccessible (for example, as a result of damage, deterioration, or normal wear), in accordance with aspects of the technology described herein. This example environment is further described with reference to FIGS. 8 and 9, for example, for use in implementing embodiments of the technical solution. Generally, the technical solution environment includes a technical solution system suitable for providing the example memory recovery system 300, which can employ methods of the present disclosure. Embodiments of the memory recovery engine 310 are performed by the CPU 110 (FIG. 1A), the SSD 122 (FIG. 1B), and the like.

As illustrated, the memory recovery system 300 includes a memory recovery engine 310 communicatively coupled to the host computing device 320. Embodiments of the host computing device 320 include an interface 322 to communicate computer operations to the memory recovery engine 310. In one embodiment, the interface 322 is configured to cause the host computing device 320 to interact with the infrastructure, components, or services provided by the memory recovery engine 310. In one embodiment, the interface 322 includes logic to control or communicate data associated with the host computing device 320. For example, the interface 322 includes a serial peripheral interface (SPI), a serial I/O port, or any suitable interfacing mechanism to enable communication between the host computing device 320 and the memory recovery engine 310. For example, a user may interact with a component of the host computing device 320, such as those illustrated with respect to FIG. 10, to cause the host computing device 320 to communicate the input to the memory recovery engine 310. In another example, the host computing device 320 is automatically operable without a user input, such that two computerized systems can communicate with each other.

Continuing with FIG. 3, the memory recovery engine 310 includes data sources 330, which include input data 332; device data 334; special address location data 336; lost data 338 (which in one example, corresponds to lost data 231 of FIG. 2A); device detection engine 340, which includes input processing engine 342, fault detection engine 344, and telemetry data determiner 346; recovery engine 350, which includes order determiner 352, special address location determiner 354, linked device location determiner 356, linked device metadata determiner 358, and lost data determiner 359; and output engine 360, which includes storage transcribing engine 364.

In some embodiments, the device detection engine 340 is configured to process inputs from the host computing device 320 and direct the inputs to a target portion of a memory cell and determines if a response to the input is returned. In one example, when the input that is directed to a target portion of a memory cell returns an output, then the device detection engine determines the particular portion of the memory cell to be adequately functioning. On the other hand, in embodiments where the input that is directed to a target portion of a memory cell fails to return an output, then the device detection engine determines that the particular portion of the memory cell can be damaged such that the recovery operation should be initiated by the recovery engine 350. Embodiments of the device detection engine 340 receive inputs and determine which subcomponent of the device detection engine 340 will process the input. In some embodiments, the inputs are stored in data sources 330 as input data 332. In one embodiment, the data sources 330 correspond to components illustrated in FIG. 1A, 1B, 9, or 10.

In some embodiments, the input processing engine 342 receives an input from the host computing device 320 to try to communicate with a particular memory cell, such as a NAND flash device 130. In one embodiment, the input is received as input data 332, which is stored in data sources 330. In one example, the input processing engine 342 receives an input to read or write to a particular NAND block of a particular NAND flash device. In one embodiment, the input processing engine 342 determines that this input is associated with a read or write operation to be executed against a particular portion (for example, a NAND block) of the NAND flash device 130. In one embodiment, where the input can communicate an associated operation with a particular memory cell, the input processing engine 342 performs the operation and returns an output to the host computing device via the output engine 360. If, however, the input cannot communicate the operation to a particular memory cell, in one embodiment, the input processing engine 342 causes fault detection engine 344 to perform a fault or error detection. Embodiments of the input processing engine 342 communicate a failure to communicate to the fault detection engine 344.

In one embodiment, the input processing engine 342 receives an input to delete particular data. In one example, data deletion can be performed in response to receiving engagement with a reset control (for example, button, touch screen, sensor, and the like). In this example, engaging with the reset control causes the data in the given address space 0 to be deleted or erased based on a NOT logic gate 242 (as discussed in FIGS. 2B, 2C, and 2D) that negates the data. Based on the address space having a 0, the input processing engine 342 causes disk wiping of the minuscule to delete the corresponding data. To avoid confusion with lost data 338, this deleted data frees up memory space, which shows the corresponding memory cell as free instead of damaged. The telemetry data discussed herein can be used to further validate the health of the memory cell. Because all the data is actually free in the deleted space of the memory cell, embodiments of the present disclosure do not associate this memory cell with an inaccessible memory cell from which data is lost. Accordingly, in one embodiment, a separate RESET bus consisting of the logic gates discussed herein frees the location and wipes data without invoking a recovery operation.

In some embodiments, the fault detection engine 344 generates one or more commands directed to various portions of a memory cell to try to assess which components of the memory cell are inaccessible. In the context of a memory cell that corresponds to a NAND flash device 150 with which the input processing engine 342 fails to communicate, embodiments of the fault detection engine 344 try to communicate with various portions of the NAND flash device 150, such as respective NAND blocks, to try to determine if any of the NAND flash device is responsive. For example, suppose the input processing engine 342 tried to establish a communication with a particular NAND block of the NAND flash device, then the fault detection engine 344 can also try to execute another command against the same NAND block to serve as a verification or check to the input processing engine 342. Continuing this example, in response to the fault detection engine 344 also failing to communicate with the particular portion of the NAND block, the fault detection engine 344 tries to communicate with other blocks in the NAND block. In some embodiments, the fault detection engine 344 also tries to communicate with related NAND flash devices 130 and their respective components. In this manner, the fault detection engine 344 can determine which memory cells and their specific portions are inaccessible so that the recovery engine can perform a recovery operation to restore the lost data 338 associated with those inaccessible memory cells. In some embodiments, this indication of the inaccessible portions of the memory cell or the indication of which memory cells are inaccessible is stored as device data 334.

In some embodiments, the telemetry data determiner 346 determines telemetry information associated with memory cells. In one embodiment, the telemetry information is stored as device data 334. As illustrated in FIG. 1B, certain memory cells, such as the NAND flash devices 130 include a sensor assembly 140. For example, the sensor assembly 140 includes a telemetry sensor that provides signals indicative of telemetry information, such as temperature or power consumption, to name a few. In some embodiments, the telemetry data determiner 346 generates time-stamped telemetry information from sensor assembly 140. From this time-stamped telemetry information, embodiments of the telemetry data determiner 346 generates a time plot of the telemetry information over time. From this plot, embodiments of the telemetry data determiner 346 determine the health of the NAND flash device 130. In one embodiment, telemetry information outside an acceptable range is correlated with damage or deterioration to the corresponding NAND flash device 130. In this manner, corresponding NAND flash devices 130 determined by the fault detection engine 344 as having a fault can be further verified and classified as needing to be serviced or replaced.

In one embodiment, the telemetry data determiner 346 determines a health metric for a memory cell or portions of the memory cell. In one embodiment, the health metric is indicative of the health of the memory cell (for example, a NAND flash device 130) or a portion of the memory cell (a NAND block of the NAND flash device 130). In some embodiments, the time plot of the telemetry information is plotted against a range of acceptable ranges of telemetry information over time. For example, upper and lower threshold values of each telemetry information (for example, temperature or power consumption) are included in the plot, and areas of deviation from these ranges are identified by the telemetry data determiner 346. Based on these regions or ranges of deviation, the telemetry data determiner 346 generates a health score. The health score and/or the data from the fault detection engine 344 can be consumed by the recovery engine 350 to perform a recovery operation.

In some embodiments, the recovery engine 350 performs a recovery operation to restore lost data to a memory cell based on data from a sequentially linked memory cell. In one embodiment, the recovery engine 350 accesses the input data 332 and the device data 334 to determine special address location data 336 and lost data 338.

In some embodiments, the order determiner 352 determines memory cells related to a particular memory cell. In one embodiment, the order determiner 352 receives, from the fault detection engine 344 of the device detection engine 340, the indication of an inaccessible memory cell. Thereafter, embodiments of the fault detection engine 344 determine a location of the inaccessible device. In one example, the location of the inaccessible device is determined based on a sequential arrangement of a plurality of memory cells. Take the embodiment illustrated in FIG. 1B as an example. In this example, sixteen memory cells, specifically NAND flash devices 130, are illustrated. Suppose the fault detection engine 344 determined the second NAND flash 130B to be faulty. Based on the indication, in this example, the order determiner 352 determines that the first NAND flash device 130A precedes the second NAND flash device 130B, and the third NAND flash device 130C follows the second NAND flash device 130B. By determining a sequential arrangement between the memory cells, embodiments of the order determiner 352 determine an order or sequential arrangement of the memory cells (for example, the NAND flash devices 130). In this manner, the recovery engine 350 can utilize data stored in these sequentially linked memory cells to recover data that may be lost or inaccessible within the inaccessible memory cell, as discussed herein.

In one example, the "order" of the memory cell corresponds to the arrangement of the memory cells within a computer memory assembly. The order may be distinct from the order in which the memory cells perform operations (for example, read and write operations), especially since certain operations can occur in parallel. In one example, the order is preset during assembly of the computer memory assembly, such that a memory cell stores the location and metadata associated with a directly linked/sequential memory cell. In another example, the order is dynamic such that when a new memory cell communicatively couples to an existing computer memory assembly, the order is updated to reflect the new memory cell. For example, when the external NAND flash device 131 of FIG. 1B communicatively couples to the SSD 122, the order is updated such that the first NAND flash device 130A is now the second device in the order. In this example, the external NAND flash device 131 is the first memory cell in the order, and the first NAND flash device 130A is the second memory cell in the order. In one embodiment, the order corresponds to a closed loop such that the first memory cell is sequentially linked to the last device in the order. In some embodiments, the order is not sequential, such that more than one device can be linked to a device.

Continuing with FIG. 3, the special address location determiner 354 of the recovery engine 350, in general, determines the special address location of a memory cell sequentially linked to an inaccessible memory cell. As discussed herein, in one example, the special address location includes, in a miniscule, metadata of a subsequent memory cell and a location of the second memory cell. For example, as mentioned above, a first memory cell includes a corresponding special address location referencing a location and metadata of a sequentially linked second memory cell.

In some embodiments, the special address location determiner 354 receives an indication of the inaccessible memory cell from fault detection engine 344 and/or received an indication of telemetry information for a memory cell (for example, the inaccessible memory cell). Thereafter, in some embodiments, the special address location determiner 354 accesses the order (for example, arrangement) of the memory cells in the computer memory assembly to identify memory cells that are sequentially linked to the inaccessible memory cell. In one embodiment, the special address location is accessed for the identified memory cell to determine the metadata and a location of the inaccessible memory cell.

Continuing with FIG. 3, the linked device location determiner 356 of the recovery engine 350, in general, determines, from a sequentially linked memory cell, a location of an inaccessible memory cell. In one example, the location of the memory cell corresponds to a pin or set of pins on the second memory cell to which the first memory cell connects. In some embodiments, the location of the memory cell includes a data entry Additionally, the linked device metadata determiner 358 of the recovery engine 350, in general, determines, from a sequentially linked memory cell, metadata of an inaccessible memory cell. In one example, the metadata corresponds to the matrix G, discussed below with respect to the lost data determiner 359.

In some embodiments, the lost data determiner 359 determines the lost data based on the metadata and location of an inaccessible memory cell. In some embodiments, the lost data determines a special address location of a memory cell sequentially linked to the inaccessible memory cell. As discussed herein, in one example, the special address location includes, in a miniscule, the metadata of a subsequently linked inaccessible memory cell and a location of the subsequently linked inaccessible memory cell. In some embodiments, such as that illustrated in FIG. 2D, an XOR-based algorithm is employed by lost data determiner 359 to determine the lost data 338 from the inaccessible memory cell. In one embodiment, the lost data determiner 359 determines the lost data 338 based on the metadata and location contained in the special address location.

In more detail, the XOR-based algorithm includes employing erasure codes, particularly those protecting against multiple failures in memory cells. In some embodiments, erasure codes provide a code-specific method for reconstruction of lost (erased) data 338. In the context of memory cells, such as RAID, this is modeled as loss of strips so that reconstruction algorithms reconstruct entire strips based on correlated sector failures, such as sequential sectors on an inaccessible memory cell.

In some embodiments, XOR-based erasure codes for disk arrays model lost data as loss of entire disks, or more precisely as loss of entire symbols of the code. In one example, a symbol typically maps to a "strip," which, in one example, refers to multiple sequential sectors with one bit of the symbol corresponding to at least one sector and with each different symbol generally residing on a different disk. In one example, the collection of related strips is called a "stripe." To deal with disk failures, certain erasure codes include a specific reconstruction algorithm that is dependent on the code construction.

Embodiments of the XOR-based algorithm allow for (1) recovery of lost data due to scattered or uncorrelated erasures and (2) recovery of partial (but sequential) data from a single lost disk (in the presence of any number of failures). The latter case may arise in the context of host I/O to a partial strip on an inaccessible portion of a memory cell.

In one embodiment, the XOR-based algorithm includes generating a generator matrix G and a parity check matrix. In one example, the generator matrix G of an erasure code converts the input "word" (for example, incoming data) into a "code word" (for example, data and parity). In one example, the parity check matrix verifies that the "code word" contains consistent data and parity (for example, parity scrub).

In one embodiment, the generator matrix has a column block structure, such that each block corresponds to a strip and each column within a block corresponds to an element within the strip. If the column contains only a single 1, then the element contains user data and is referred to herein, in one example, as an "identity column" because it is a column of an identity matrix. If the column contains multiple 1s, then it corresponds to an element that is the XOR sum of some set of user data elements, such that the element is a parity element. In other words, the generator matrix can specify the data and parity layout on the strips, the logical ordering of the strips within the stripe, and the equations used to compute parity values. For example, the generator matrix for the EVENODD(3,5) code with prime, p=3, on 5 disks is $$G = \begin{pmatrix} 1 & 0 & | & 0 & 0 & | & 0 & 0 & | & 1 & 0 & | & 1 & 0 \\ 0 & 1 & | & 0 & 0 & | & 0 & 0 & | & 0 & 1 & | & 0 & 1 \\ 0 & 0 & | & 1 & 0 & | & 0 & 0 & | & 1 & 0 & | & 0 & 1 \\ 0 & 0 & | & 0 & 1 & | & 0 & 0 & | & 0 & 1 & | & 1 & 1 \\ 0 & 0 & | & 0 & 0 & | & 1 & 0 & | & 1 & 0 & | & 1 & 1 \\ 0 & 0 & | & 0 & 0 & | & 0 & 1 & | & 0 & 1 & | & 1 & 0 \end{pmatrix}. \quad (1)$$

The generator matrix for disk arrays may have an identity column for each user data element. In this manner, this data can be copied to the element's sectors in some strip and can then be read with minimal I/O costs. In one example, a generator matrix of this form is called "systematic."

Moreover, let D be a row vector of input user data values, then the row vector S, given by the expression $$S = D \cdot G, \quad (2)$$

represents the data and parity elements that are stored in the stripe on the disks. In one example, the vector D is indexed by the logical addresses of the user data values (for example, as viewed by the host). In one example, the vector S represents the physical addresses of the data and parity elements, including both the disk (for example, the strip, identified by the block of the generator matrix) and the sector addresses on the disk (for example, the offset within the strip, identified by the column within the block). Embodiments of S are also block-structured with blocks matching those of G.

If there are N data elements input into the code and Q parity elements computed by the code, then the generator matrix has dimensions N×(N+Q). In this example, N is the total number of data elements within a stripe, not the number of strips; similarly, Q is the number of parity elements in the stripe, not the number of parity strips.

The "parity check matrix," H, has dimensions (N+Q)×Q and can be derived from the generator matrix (and vice versa). Certain communication channels use the parity check matrix to detect errors. Each column of the parity check matrix, H, corresponds to a parity element. In one embodiment, after the data and parity are read off the channel, the parity is XOR-ed with the data as indicated by its corresponding column to produce a "syndrome." If a syndrome is not zero, an error may have occurred (either in the received parity symbol or in one of the dependent data symbols). For certain erasure codes in disk arrays, this is a parity consistency check (or parity scrub). In other words, with S=D·G as above, the test is a parity consistency check.

$$S \cdot H == 0 \quad (3)$$

In some embodiments, the parity check matrix, H, is row-blocked exactly corresponding to the column blocks of G (or S), and it can be arranged to contain an embedded identity matrix (corresponding to the parity elements). The parity check matrix for the example generator matrix G above is the following:

$$H = \begin{pmatrix} 1 & 0 & 1 & 0 \\ 0 & 1 & 0 & 1 \\ \hline 1 & 0 & 0 & 1 \\ 0 & 1 & 1 & 1 \\ \hline 1 & 0 & 1 & 1 \\ 0 & 1 & 1 & 0 \\ \hline 1 & 0 & 0 & 0 \\ 0 & 1 & 0 & 0 \\ \hline 0 & 0 & 1 & 0 \\ 0 & 0 & 0 & 1 \end{pmatrix}. \quad (4)$$

In one embodiment, the generator matrix is used to compute the data and parity (and its layout) for storage on the disks. The parity check matrix can be used when the data and parity are read off the disk (e.g., during parity scrub) to look for errors.

If a code can tolerate t≥1 lost disks or strips, then G has the property that if any t blocks of G are removed (or zeroed), then the resulting matrix has a full row rank. The parity check matrix is full column rank because of the embedded identity matrix. Accordingly, the following holds true for every data vector D:

$$D \cdot G \cdot H = 0 \quad (5)$$

This means that G·H=0 identically, so that each vector in H is in the null space of G. A simple dimensionality argument shows that in fact H is a basis of the null space of G.

In addition, it should be clear that if G is systematic, then there exists an M×N matrix, $R_0$, containing an embedded identity matrix of size N×N so that $R_0$ is a pseudo-inverse for G. In one example, $R_0$ picks off the embedded systematic portion of G. If G is not systematic, a pseudo-inverse $R_0$ can still be constructed.

In some embodiments, the XOR-based algorithm employed by the lost data determiner 359 includes simulating scattered sector loss and reconstruction. As set forth above, a t-fault-tolerant code G has the property that zeroing any t blocks of G should leave G full rank so that a complete pseudo-inverse for G exists. Similarly, the correlated and/or uncorrelated sector loss can be simulated by zeroing or removing the associated individual columns from G. Certain combinations of uncorrelated sector losses result in some or all data loss events (some or all lost sectors having unrecoverable data); other combinations may involve no data loss events. In this manner, the XOR-based algorithm can determine which sectors become data loss events, and for those that do not, can provide a reconstruction formula for the data from these sectors.

For example, suppose a set F of failed sectors are detected in a stripe (correlated, perhaps because of disk failure, or uncorrelated, because of medium errors, or a combination of these). Further, ignoring the block structure of G, let Ĝ be a version of a generator matrix G, with zeroed columns corresponding to the sectors in F. Suppose we can find a matrix R of size M×N so that (1) R is a partial pseudo-inverse of Ĝ, and (2) R has zeros in all rows that correspond to the lost columns of Ĝ. The columns of R can be associated with the user data values in D.

Mathematically, certain theorems can be proved for G, Ĝ, and R. In particular, any theoretically recoverable user data value corresponds to a non-zero column of R, and the non-zero bit positions indicate the data and parity elements whose XOR sum equals the data value. In one instance, a directly readable data value corresponds to an identity column in R. In one instance, a data loss event (unrecoverable data value) corresponds to an all-zero column of R.

To prove this, let $\hat{S}$ be the vector S (from equation [2] above) but with zeros in the positions corresponding to the lost elements (the zeroed columns of G). Then the following holds true:

$$D \cdot \hat{G} = \hat{S}. \quad (6)$$

Consequently:

$$\hat{S} \cdot R = D \cdot \hat{G} \cdot R = D \cdot J_K = \hat{D}, \quad (7)$$

where $\hat{D}$ is the vector D with zeros in all locations corresponding to zeros on the diagonal of $J_K$, which also corresponds to the all-zero columns of R.

Since $J_K$ is uniquely determined by $\hat{G}$, in this example, any zero diagonal entry of $J_K$ induces a zero in $\hat{D}$. This induced zero corresponds to a data loss event. Any non-zero diagonal entry of $J_K$ induces a non-zero (for example, not identically zero) data value in $\hat{D}$. But the non-zero diagonal entries of $J_K$ correspond to non-zero columns of R, and the zero diagonal entries correspond to all-zero columns of R.

Now consider a non-zero column of R. In this example, each non-zero bit in such a column selects a data or parity element from $\hat{S}$ to be input into an XOR formula. Because R has zeros in row positions corresponding to zeroed positions in $\hat{S}$, such a formula does not depend on any lost data or parity element. The XOR formula for this example then indicates that a specific XOR sum of known data and parity elements equals the data value associated to that column, as illustrated in FIG. 2D. That is, such a column provides a formula for the reconstruction.

We emphasize that this theorem makes no assumptions about the location of the failed sectors, whether they are correlated, uncorrelated or both. Consequently, the theorem can be applied to the case of full disk/strip losses (highly correlated) or even to the case where there is a lost sector on every strip (highly uncorrelated). It also does not depend on any special structure (for example geometric layout) of the erasure code. In this example, all the information needed is embedded within the generator matrix. As set forth above, R is not necessarily unique, and that, given a basis for the null space of $\hat{G}$, it is easy to construct (as shown in equation [1]) other pseudo-inverses that satisfy the same properties as R in the theorem.

Embodiments of the lost data determiner 359 construct pseudo-inverses and bases for null spaces as part of the XOR-based algorithm. In some embodiments, the null space improves the sparseness of the pseudo-inverse. Fundamentally, pseudo-inverses and null space bases are equivalent, though the data structures and approaches differ somewhat.

Suppose B is a matrix whose columns form a null space basis for some zeroed matrix $\hat{G}$, perhaps with all-zero column vectors as padding. Embodiments of the lost data determiner 239 ignore the block structure of G. As a result, without loss of generality, the generator matrix G has its systematic identity submatrix in the first N columns, with the parity columns in the right-most columns of Q. In one example, this matrix structured is called "left systematic."

As discussed above, in some embodiments, the lost data determiner 359, employing the XOR-based algorithm, receives the original generator matrix G (and/or its parity check matrix H) and a list F of data or parity elements which are declared lost (unreadable) in the stripe. The generator matrix G and the list F can be received from other components of the device detection engine 340 or recovery engine 350, for example, as data from the data sources 330. In one embodiment, the lost data determiner 359, employing the XOR-based algorithm, outputs two matrices R and B. In one example, R is a pseudo-inverse of $\hat{G}$ (obtained from G by zeroing the columns of G corresponding to the elements in F), and B is a basis for the null space of $\hat{G}$.

Embodiments of the lost data determiner employ linear algebra computations, such as "column operations" and/or "row operations" to manipulate matrices. This computationally efficient operation facilitates scaling and minimizes network or system bandwidth consumption. Certain column operations are equivalent to right multiplication by simple matrices (for rows, the operations are on the left).

Consider three simplified column (or row) operations. The first operation includes "swap" in which two columns (or rows) are exchanged. The second operation includes "sum and replace" in which column c is added to column d (modulo 2) and column d is replaced with the sum (similarly for rows). The third operation includes "zero," whereby all the entries in a column (or row) are assigned a value of zero. The first two are invertible (reversible) operations, the third operation is not.

In one embodiment, the lost data determiner 359 employs "column-incremental" construction, either as a dynamic or on-line algorithm. By employing the column-incremental construction algorithm, the lost data determiner 359 updates data structures as new lost sectors on certain strips are detected (simulated by an incremental processing of the elements in F).

Embodiments of the lost data determiner 359 determine parity bits of the lost data based on at least one of the pseudo-inverse matrix, the generator matrix, and/or the parity check matrix. In one embodiment, the lost data is recovered based on the parity bits. For example, restoring the lost data includes adding the parity bits determined to be stored in the inaccessible memory cell.

In more detail, to add a parity element back in to the matrices, in one example, the lost data determiner 359 accesses the original parity column from the generator matrix G. Suppose that this parity is indexed by column c in G. In one embodiment, the lost data determiner 359 accesses this parity column and for each 1 in the column, sums together the corresponding columns of R in W and places the result in an all-zero column of B in W. In one embodiment, the lost data determiner 359 replaces the zero in position c of this new column by 1 and replaces column c of $G_0$ by this parity column. In some embodiments, the lost data determiner 359 can perform a similar operation on the restored data column, the lost data determiner 359 sets the (r,r) position in the inverse portion of W to 1. In one example, in the case of a parity column, no such position exists in the inverse portion, so the lost data determiner 359 skips this step.

It should be understood that the lost data determiner 359 can recover the parity bits using any additional or alternative algorithm, including a code-specific hybrid reconstruction, a generic hybrid reconstruction, and so forth.

In this section, in the context of a hybrid reconstruction method, the lost data determiner 359 applies the reconstruction methodology based on the matrix method in another way to address the problem of partial strip reconstruction. Suppose the array's erasure code can tolerate two strip failures. Most such erasure codes have a recursive algorithm defined for reconstructing the two lost strips to efficiently rebuild both lost strips in their entirety. In some embodiments, this method is code-dependent; that is, the recursion will depend on the specific code layout and parity formulas.

On the other hand, the matrix methodology can be more generic, especially if applied without the Reverse Incremental construction, such that no intermediate results are used. Consequently, in one embodiment, the amount of XOR computation could be larger than a recursive method. However, the reverse incremental construction can take advantage of intermediate results and improve overall XOR computation costs. In fact, if applied appropriately, the matrix method (including the Reverse Incremental construction) can reduce to the recursive method in most cases.

As another example, consider a host request to read a single block from one of the two lost strips (prior to completion of any background process to reconstruct the stripe). If the element is very deep into the recursion, a number of intermediate reconstructions (of lost elements) may take place. In one example, these intermediate results are not needed for the immediate host request and, though they can be cached, are potentially extraneous work. The matrix method above, however, gives an improved technique for direct reconstruction of any single element without reconstruction of any additional elements. For single element reconstruction, the generic direct method of the matrix methodology is generally more efficient than the recursive method provided with a specific code. Conversely, for reconstruction of all lost elements, the recursive method can be more computationally efficient (either explicitly using the code's specific theory or implicitly using the matrix method together with the Reverse Incremental construction).

As another example, consider the problem of reconstructing a partial strip, for example, responsive to a host read for multiple consecutive blocks that span multiple elements in a strip. Further assume that multiple strips are lost. To address this scenario, embodiments of the lost data determiner 359 access the set of lost sectors F, the parity check matrix (or the generator matrix), and a subset T of F containing sectors to reconstruct (we assume that no element in T is a data loss event). Thereafter, embodiments of the lost data determiner 359 output are the data values for the elements in T. In this example, F is the complete set of lost sectors and T is that partial set to be constructed.

After the lost data is determined, the output engine 360 receives the lost data that has been recovered by the lost data determiner and stores the data as lost data 338. In one embodiment, the lost data corresponds to the parity bits that are determined based on the XOR-based algorithm described herein. In one embodiment, the storage transcribing engine 364 transcribes the lost data 338 to a memory cell so that a computer memory assembly can access the lost data 338. In some embodiments, the transcribed lost data is used to determine lost data from another subsequently linked device. For example, after the first special address location of a first device is used to recover lost data 338 from a second device, the data recovered for the second device can be used to recover lost data from a third device sequentially linked to the second device, and so forth.

Figure 4A:
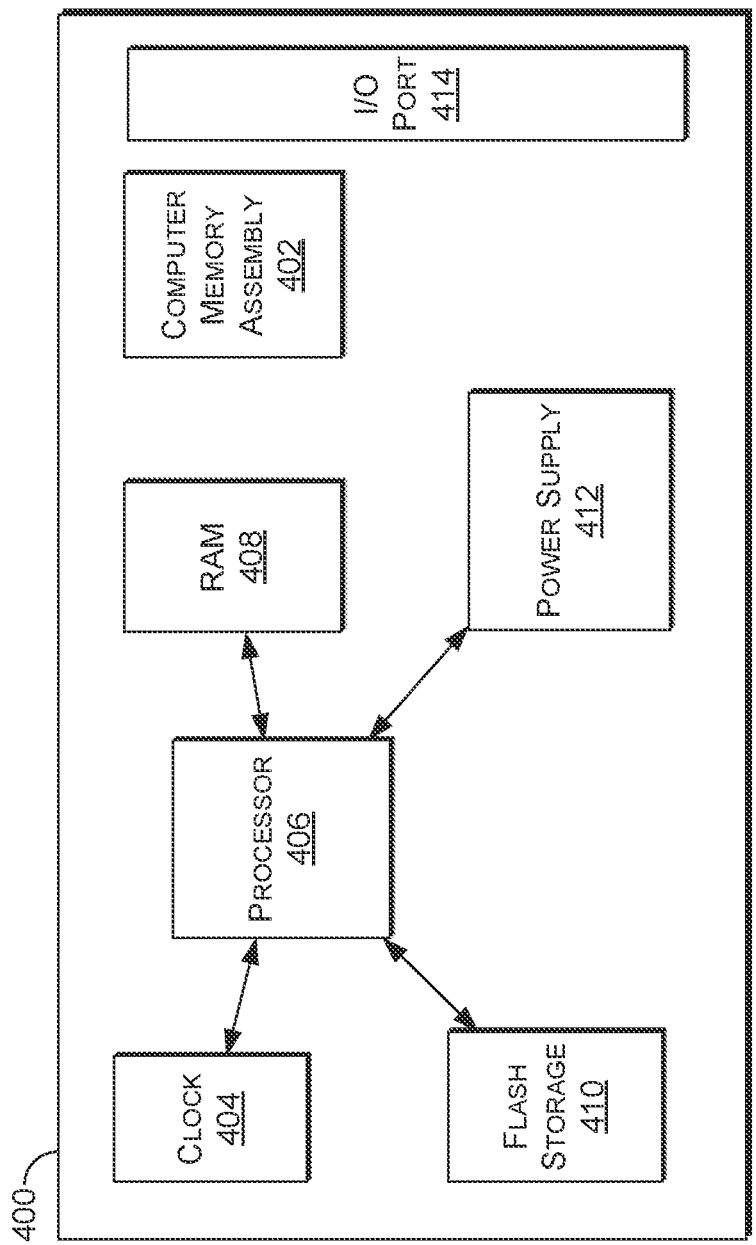
FIG. 4A depicts a block diagram of an example computing device having a computer memory assembly modified in accordance with aspects of the technology described herein that has been incorporated into the computing device.

Turning to FIG. 4A, depicted is a block diagram of a computing device 400 having a computer memory assembly 402 modified in accordance with aspects of the technology described herein that has been incorporated into the computing device 400. The example computing device 400 includes a clock 404, a processor 406, RAM 408, flash storage 410, a power supply 412, and an I/O port 414. In this example, the computer memory assembly 402 can include the SSD 122 of FIG. 1B. Moreover, the computing device 400 can implement the memory recovery engine 310 of FIG. 3 to recover lost data 338 from an inaccessible device, as discussed herein. In the embodiment illustrated in FIG. 4A, the computer memory assembly 402 that incorporates the memory recovery engine 310 is all included within the computing device 400. In contrast, the embodiment of FIG. 4B allows the embodiments of the memory recovery engine 310 to be incorporated into the computing device 400 by way of an external computer memory assembly 430 that interfaces with the computing device via an I/O port 414.

Figure 4B:
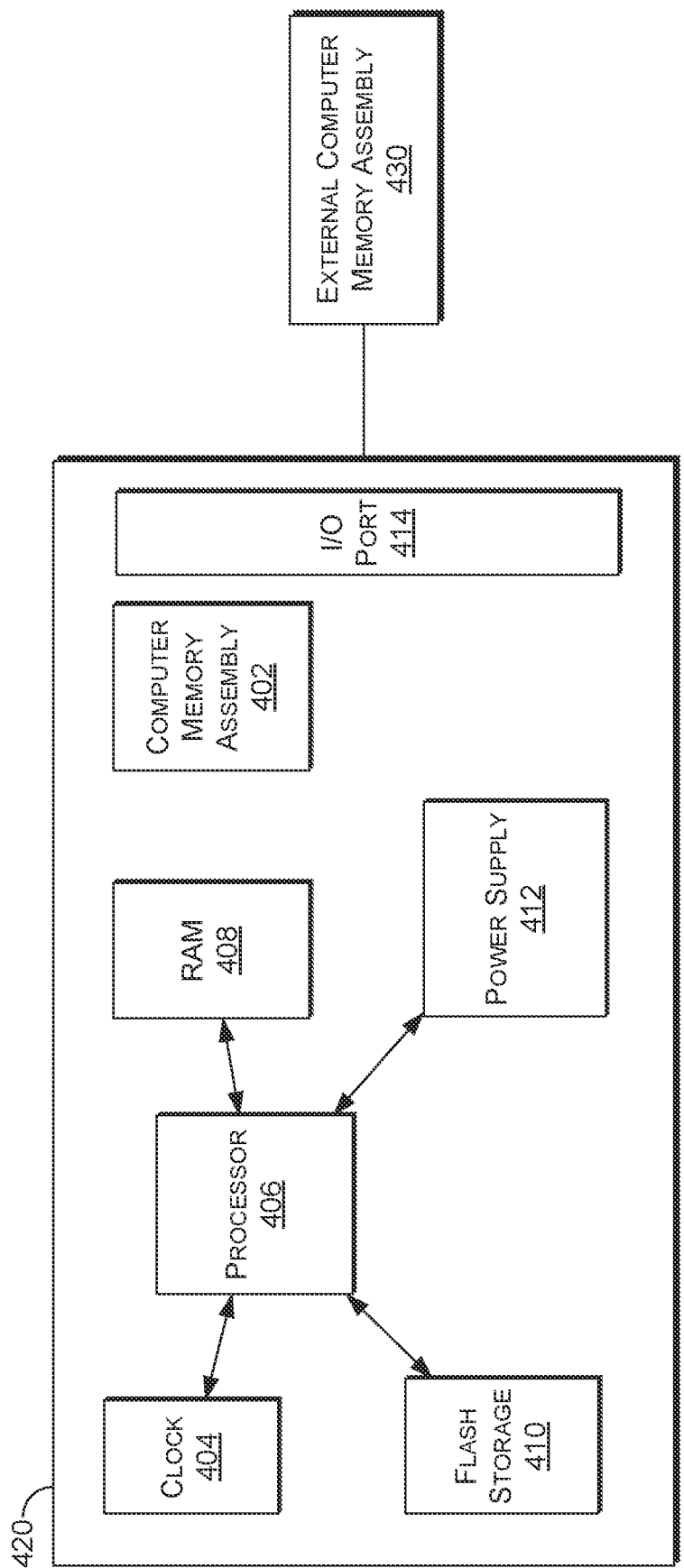
FIG. 4B depicts a block diagram of an example computing device having a computer memory assembly modified in accordance with aspects of the technology described herein and that interfaces with an external computer memory assembly via an input/output (I/O) port.

To that end, FIG. 4B depicts a block diagram of an example computing device 420 having a computer memory assembly 402 modified in accordance with aspects of the technology described herein and that interfaces with an external computer memory assembly 430 via an input/output (I/O) port 414. Accordingly, the external computer memory assembly 430 can interface with the computer memory assembly via the I/O port 414 so that a memory cell of the external computer memory assembly 430 can store a special address location. As discussed herein, in one example, the special address location can be stored in a miniscule and include metadata and location information about a sequentially linked memory cell of the computer memory assembly 402.

Figure 5:
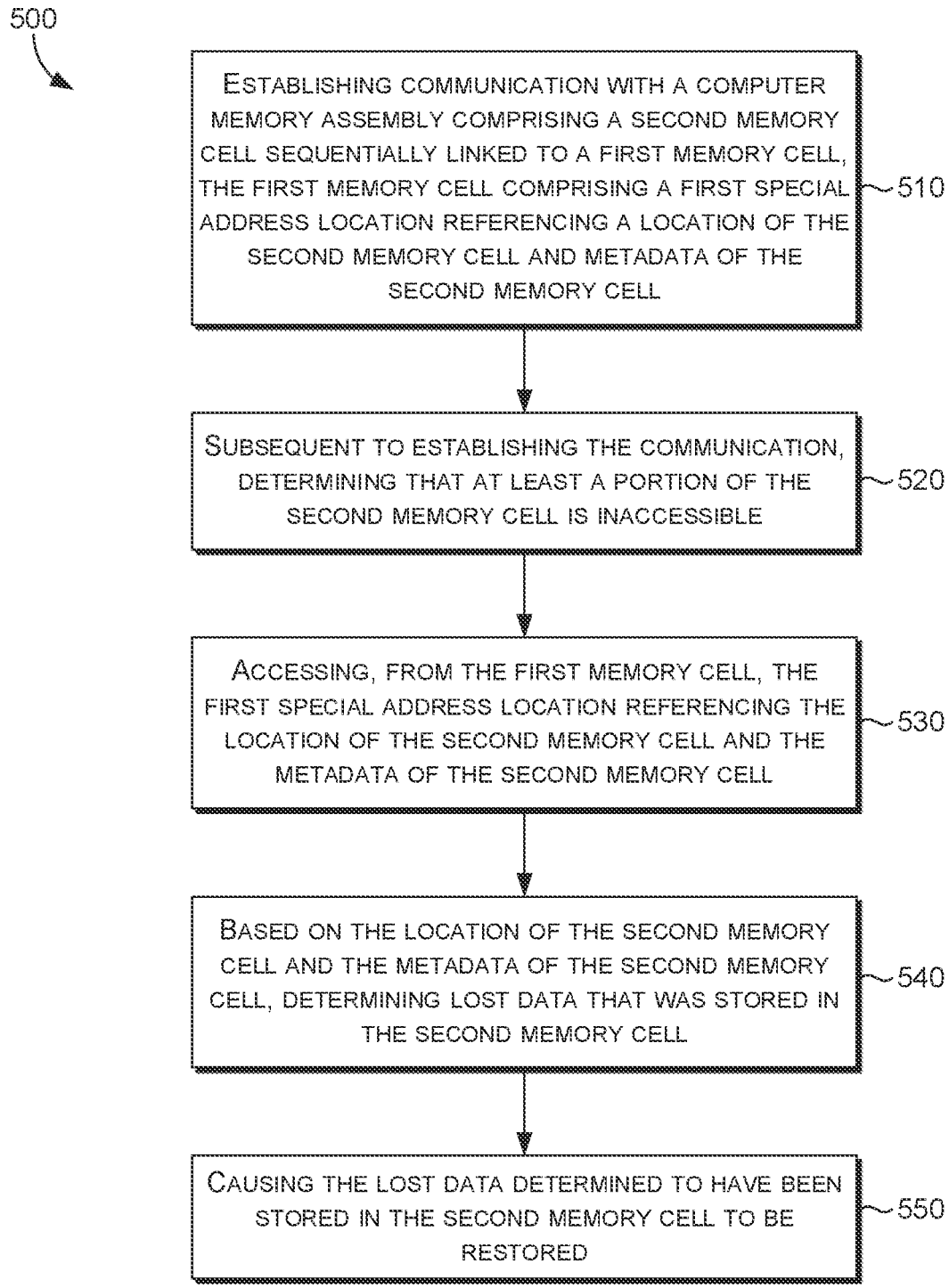
FIG. 5 depicts a first example method to programmatically cause lost data determined to have been stored in the second memory cell to be restored, in accordance with aspects of the technology described herein.
Figure 6:
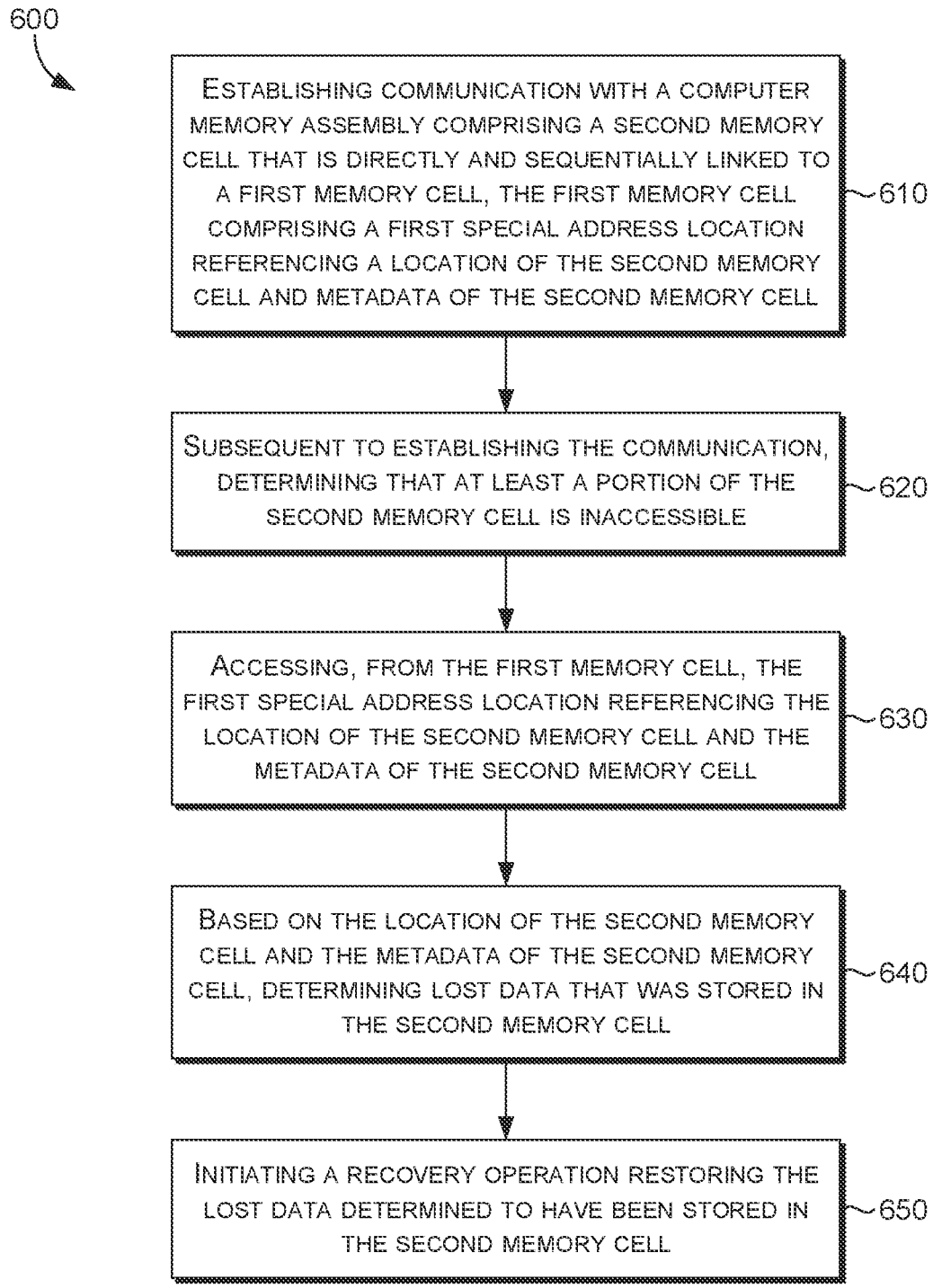
FIG. 6 depicts a second example method to programmatically determine lost data that was stored on the second memory cell and initiate a recovery operation restoring the lost data to the second memory cell, in accordance with aspects of the technology described herein.
Figure 7:
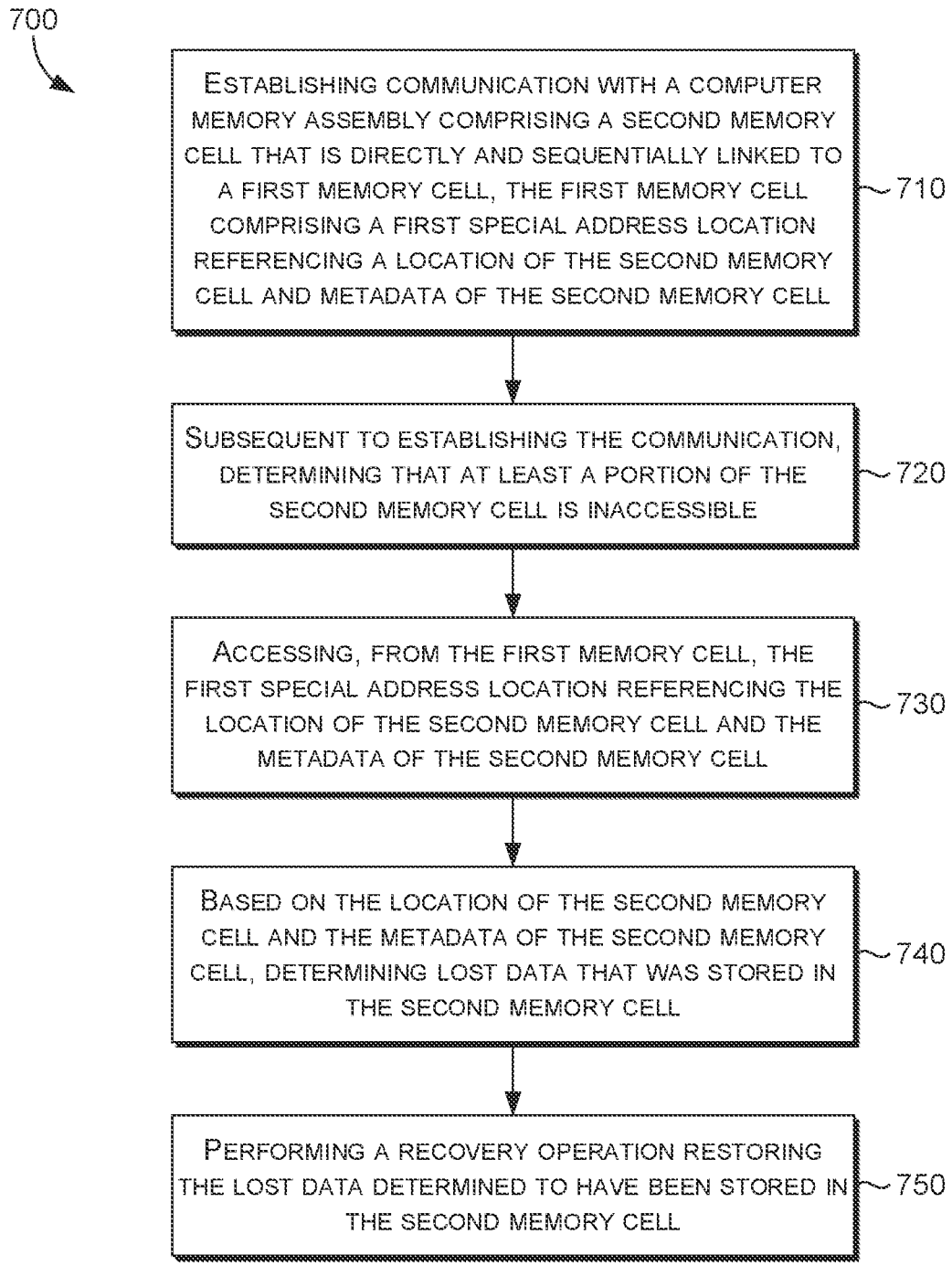
FIG. 7 depicts a third example method to programmatically determine lost data that was stored on the second memory cell and perform a recovery operation restoring the lost data to the second memory cell, in accordance with aspects of the technology described herein.

With reference to FIGS. 5, 6, and 7, flow diagrams are provided illustrating methods to programmatically cause lost data determined to have been stored in the second memory cell to be restored. In some embodiments, one or more components of the computing device 100 (FIG. 1A), the SSD 122 (FIG. 1B), the memory recovery system 300 (FIG. 3), and/or the other elements described herein perform the methods illustrated in FIGS. 5, 6, and 7. In some embodiments, one or more computer storage media having computer-executable or computer-useable instructions embodied thereon that, when executed by one or more processors, cause the one or more processors to perform the methods (e.g., computer-implemented method) in the memory recovery system 300 (e.g., a computerized system or computing system).

Turning to FIG. 5, at block 510, the process 500 includes establishing communication with the computer memory assembly, such as an SSD 122 (FIG. 1B). In some embodiments, the computer memory assembly includes a plurality of memory cells, such as the NAND flash devices 130 (FIG. 1B). For example, the computer memory assembly includes a first memory cell and a second memory cell. In this example, the second memory cell is directly and sequentially linked to the first memory cell. In one example, the first memory cell includes a first special address location referencing a location of the second memory cell and metadata of the second memory cell. At block 520, the process 500 includes, subsequent to establishing the communication, determining that at least a portion of the second memory cell is inaccessible, for example, due to data on the second memory cell not being readable as a result of damage or deterioration of the second memory cell. At block 530, the process 500 includes accessing, from the first memory cell, the first special address location referencing the location of the second memory cell and the metadata of the second memory cell. At block 540, the process 500 includes, based on the location of the second memory cell and the metadata of the second memory cell, determining lost data that was stored in the second memory cell. In one example, the content determined to have been stored in the second memory cell corresponds to lost data 338 (FIG. 3). At block

550, the process 500 includes causing the lost data determined to have been stored in the second memory cell to be restored.

Turning to FIG. 6, at block 610, the process 600 includes establishing communication with the computer memory assembly, such as an SSD 122 (FIG. 1B). In some embodiments, the computer memory assembly includes a plurality of memory cells, such as the NAND flash devices 130 (FIG. 1B). For example, the computer memory assembly includes a first memory cell and a second memory cell. In this example, the second memory cell is directly and sequentially linked to the first memory cell. In one example, the first memory cell includes a first special address location referencing a location of the second memory cell and metadata of the second memory cell. At block 620, the process 600 includes, subsequent to establishing the communication, determining that at least a portion of the second memory cell is inaccessible. At block 630, the process 600 includes accessing, from the first memory cell, the first special address location referencing the location of the second memory cell and the metadata of the second memory cell. At block 640, the process 600 includes, based on the location of the second memory cell and the metadata of the second memory cell referenced by the first special address location, determining lost data that was stored in the second memory cell. At block 650, the process 600 includes initiating a recovery operation restoring the lost data determined to have been stored in the second memory cell.

Turning to FIG. 7, at block 710, the process 700 includes establishing communication with the computer memory assembly, such as an SSD 122 (FIG. 1B). In some embodiments, the computer memory assembly includes a plurality of memory cells, such as the NAND flash devices 130 (FIG. 1B). For example, the computer memory assembly includes a first memory cell and a second memory cell. In this example, the second memory cell is directly and sequentially linked to the first memory cell. In one example, the first memory cell includes a first special address location referencing a location of the second memory cell and metadata of the second memory cell. At block 720, the process 700 includes, subsequent to establishing the communication, determining that at least a portion of the second memory cell is inaccessible. At block 730, the process 700 includes accessing, from the first memory cell, the first special address location referencing the location of the second memory cell and the metadata of the second memory cell. At block 740, the process 700 includes, based on the location of the second memory cell and the metadata of the second memory cell referenced by the first special address location, determining lost data that was previously stored in the second memory cell. At block 750, the process 700 includes performing a recovery operation restoring the lost determined to have been stored in the second memory cell.

Other Embodiments

In some embodiments, a computerized system is provided, employing any components of the computerized (or computer, computing, or cloud) system described in any of the embodiments above. The computerized system comprises a computer memory assembly that includes a first memory cell and a second memory cell directly and sequentially linked to the first memory cell. The first memory cell comprises a first special address location referencing a location of the second memory cell and metadata of the second memory cell. The first special address location is readable by a processor configured to perform operations. The operations include establishing communication with the computer memory assembly; subsequent to establishing the communication, determining that at least a portion of the second memory cell is inaccessible; accessing, from the first memory cell, the first special address location referencing the location of the second memory cell and the metadata of the second memory cell; based on the location of the second memory cell and the metadata of the second memory cell, determining lost data that was stored in the second memory cell; and causing the lost data determined to have been stored in the second memory cell to be restored.

In any combination of the above embodiments of the computerized system, the first special address location comprises a first plurality of logic gates comprising a first AND gate and a first NOT gate that reference the location of the second memory cell and the metadata of the second memory cell.

In any combination of the above embodiments of the computerized system, the computer memory assembly comprises a third memory cell directly and sequentially linked to the second memory cell.

In any combination of the above embodiments of the computerized system, the second memory cell comprising a second special address location comprising a second plurality of logic gates comprising a second AND gate and a second NOT gate that reference a location of the third memory cell and metadata of the third memory cell.

In any combination of the above embodiments of the computerized system, the first memory cell and the third memory cell are indirectly coupled to each other by way of the second memory cell.

In any combination of the above embodiments of the computerized system, the first and second special address locations form a chain connection sequentially relating the second memory cell to the first memory cell and the third memory cell to the second memory cell, respectively.

In any combination of the above embodiments of the computerized system, the second memory cell does not store a special address location referencing information about the first memory cell.

In any combination of the above embodiments of the computerized system, the computerized system further includes a computing system comprising the processor and an input/output port, wherein the computer memory assembly is external to the computing system and configured to communicatively couple to the processor of the computing system via the input/output port.

In any combination of the above embodiments of the computerized system, determining the lost data that was stored in the second memory cell comprises: generating, based on the first special address location, a generator matrix and a parity check matrix; simulating scatter sector loss and reconstruction based on the generator matrix and the parity check matrix; constructing a pseudo-inverse matrix based on the generator matrix and the parity check matrix; and determining parity bits based on at least one of the pseudo-inverse matrix, the generator matrix, or the parity check matrix, wherein the lost data determined to have been stored in the second memory cell is recovered based on the parity bits, wherein restoring the lost data comprises adding the parity bits determined to be stored in the second memory cell.

In any combination of the above embodiments of the computerized system, the second memory cell comprises a sensor that detects telemetry data comprising at least one of temperature data or power data, wherein at least one operation of the operations is performed in response to the processor receiving an indication of the telemetry data deviating from a target range.

In any combination of the above embodiments of the computerized system, determining the lost data that was stored in the second memory cell comprises: performing a reverse incremental construction; and based at least on the reverse incremental construction, determining parity bits determined to be stored in the second memory cell, wherein the parity bits are added based on the reverse incremental construction.

In some embodiments, a computer-implemented method is provided. The computer-implemented method includes establishing communication with a computer memory assembly comprising (1) a first memory cell and (2) a second memory cell that is directly and sequentially linked to the first memory cell. The first memory cell comprising a first special address location referencing a location of the second memory cell and metadata of the second memory cell. The computer-implemented method includes subsequent to establishing the communication, determining that at least a portion of the second memory cell is inaccessible; accessing, from the first memory cell, the first special address location referencing the location of the second memory cell and the metadata of the second memory cell; based on the location of the second memory cell and the metadata of the second memory cell referenced by the first special address location, determining lost data that was stored in the second memory cell; and initiating a recovery operation restoring the lost data determined to have been stored in the second memory cell.

In any combination of the above embodiments of the computer-implemented method, the first special address location comprises a first plurality of logic gates comprising a first AND gate and a first NOT gate that reference the location of the second memory cell and the metadata of the second memory cell.

In any combination of the above embodiments of the computer-implemented method, the lost data is determined and restored without reading data from a backup storage of a datacenter storing at least a portion of similar data to that stored in the second memory cell.

In any combination of the above embodiments of the computer-implemented method, determining the lost data that was stored in the second memory cell comprises: performing a reverse incremental construction; and based at least on the reverse incremental construction, determining parity bits determined to be stored in the second memory cell, wherein the parity bits are added based on the reverse incremental construction.

In any combination of the above embodiments of the computer-implemented method, the recovery operation comprises writing, to the computer memory assembly, the lost data determined to have been stored in the second memory cell.

In any combination of the above embodiments of the computer-implemented method, the at least a portion of the second memory cell is inaccessible due to at least one of: damage to the second memory cell, inability to communicate with the second memory cell, the second memory cell not having been deleted in response to an input to delete content corresponding to the lost data, or telemetry information for the second memory cell being outside a normal range.

In some embodiments, one or more computer storage media are provided and have computer-executable instructions embodied thereon that, when executed by a computing system having at least one processor and at least one memory, cause the at least one processor to perform operations. The operations include establishing communication with a computer memory assembly comprising (1) a first memory cell and (2) a second memory cell that is directly and sequentially linked to the first memory cell. The first memory cell comprising a first special address location referencing a location of the second memory cell and metadata of the second memory cell. The operations further include subsequent to establishing the communication, determining that at least a portion of the second memory cell is inaccessible; accessing, from the first memory cell, the first special address location referencing the location of the second memory cell and the metadata of the second memory cell; based on the location of the second memory cell and the metadata of the second memory cell referenced by the first special address location, determining lost data that was stored in the second memory cell; and performing a recovery operation restoring the lost data determined to have been stored in the second memory cell In any combination of the above embodiments of the one or more computer storage media, the recovery operation comprises writing, to the computer memory assembly, the lost data determined to have been stored in the second memory cell, wherein the lost data is written without reading from a backup storage of a datacenter that stores a copy of data stored in the computer memory assembly.

In any combination of the above embodiments of the one or more computer storage media, determining the lost data that was stored in the second memory cell comprises: generating, based on the first special address location, a generator matrix and a parity check matrix; simulating scatter sector loss and reconstruction based on the generator matrix and the parity check matrix; constructing a pseudo-inverse matrix based on the generator matrix and the parity check matrix; and determining parity bits based on at least one of the pseudo-inverse matrix, the generator matrix, or the parity check matrix, wherein the lost data determined to have been stored in the second memory cell is recovered based on the parity bits, wherein restoring the lost data comprises adding the parity bits determined to be stored in the second memory cell.

Example Computing Environment

Figure 8:
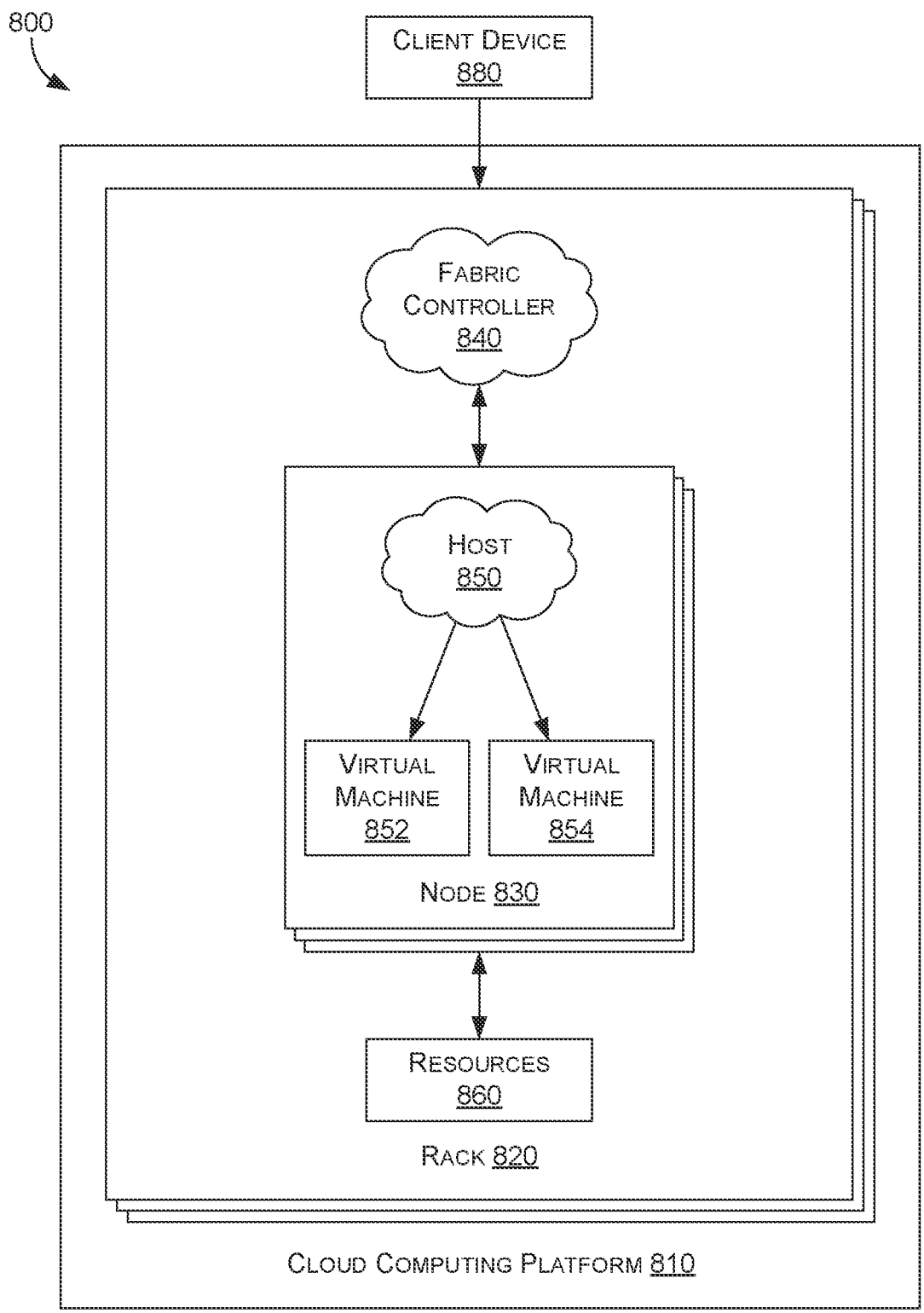
FIG. 8 depicts a block diagram of an example distributed computing environment suitable for use in implementing aspects of the technology described herein.
Figure 9:
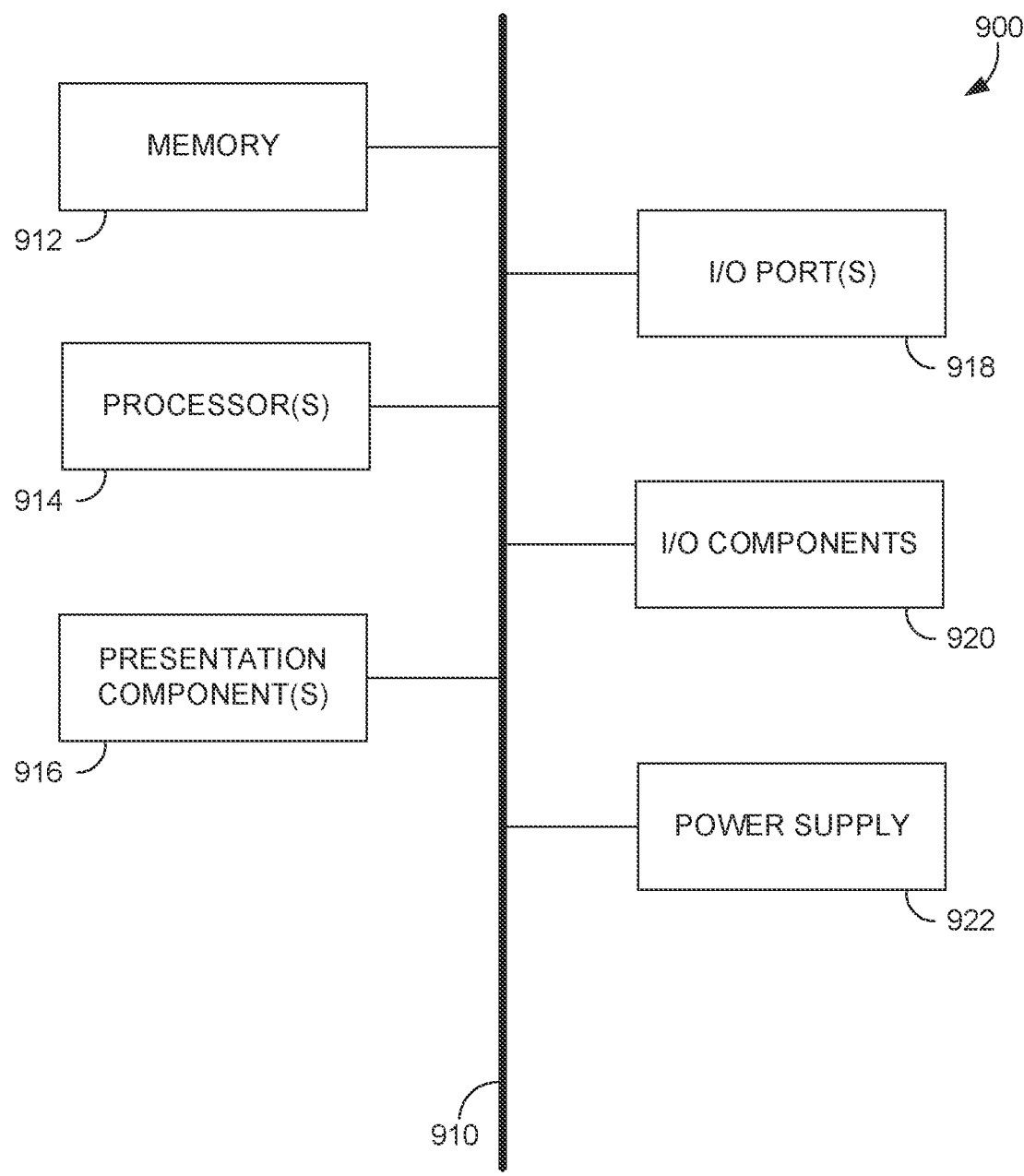
FIG. 9 is a block diagram of an example computing device suitable for use in implementing aspects of the technology described herein.

Having described various implementations, example computing environments suitable for implementing embodiments of the disclosure are now described, including an example distributed computing environment and an example computing device in FIGS. 8 and 9, respectively. Embodiments of the disclosure are described in the general context of computer code or machine-useable instructions, including computer-useable or computer-executable instructions, such as program modules, being executed by a computer or other machine such as a smartphone, a tablet, personal computer (PC), or other mobile device, server, or client device. Generally, program modules, including routines, programs, objects, components, data structures, and the like, refer to code that performs particular tasks or implements particular abstract data types. Embodiments of the disclosure are practiced in a variety of system configurations, including mobile devices, consumer electronics, general-purpose computers, more specialty computing devices, or the like. Embodiments of the disclosure are also practiced in distributed computing environments where tasks are performed by remote-processing devices that are linked through a communications network. In a distributed computing environment, program modules may be located in both local and remote computer storage media including memory storage devices.

Some embodiments comprise an end-to-end software-based system that can operate within system components described herein to operate computer hardware to provide system functionality. At a low level, hardware processors may execute instructions selected from a machine language (also referred to as machine code or native) instruction set for a given processor. The processor recognizes the native instructions and performs corresponding low-level functions relating to, for example, logic, control, and memory operations. Low-level software written in machine code can provide more complex functionality to higher levels of software. Accordingly, in some embodiments, computer-executable instructions include any software, including low-level software written in machine code, higher level software such as application software, and any combination thereof. In this regard, the system components can manage resources and provide services for system functionality. Any other variations and combinations thereof are contemplated with the embodiments of the present disclosure.

Referring now to FIG. 8, FIG. 8 illustrates an example distributed computing environment 800 in which implementations of the present disclosure can be employed. In particular, FIG. 8 shows a high-level architecture of an example cloud computing platform 810 that can host a technical solution environment or a portion thereof (e.g., a data trustee environment). It should be understood that this and other arrangements described herein are set forth only as examples. For example, as described above, many of the elements described herein are implemented as discrete or distributed components or in conjunction with other components, and in any suitable combination and location. Other arrangements and elements (e.g., machines, interfaces, functions, orders, and groupings of functions) can be used in addition to or instead of those shown.

Data centers can support distributed computing environment 800, which includes cloud computing platform 810, rack 820, and node 830 (e.g., computing devices, processing units, or blades) in rack 820. The technical solution environment can be implemented with cloud computing platform 810 that runs cloud services across different data centers and geographic regions. Cloud computing platform 810 can implement fabric controller 840 component for provisioning and managing resource allocation, deployment, upgrade, and management of cloud services. Typically, cloud computing platform 810 acts to store data or run service applications in a distributed manner. Cloud computing platform 810 in a data center can be configured to host and support operation of endpoints of a particular service application. Cloud computing platform 810 may be a public cloud, a private cloud, or a dedicated cloud.

Node 830 can be provisioned with host 850 (e.g., operating system or runtime environment) running a defined software stack on node 830. Node 830 can also be configured to perform specialized functionality (e.g., compute nodes or storage nodes) within cloud computing platform 810. Node 830 is allocated to run one or more portions of a service application of a tenant. A tenant can refer to a customer utilizing resources of cloud computing platform 810. Service application components of cloud computing platform 810 that support a particular tenant can be referred to as a multi-tenant infrastructure or tenancy. The terms service application, application, or service are used interchangeably herein and broadly refer to any software, or portions of software, that run on top of storage, access storage, and compute device locations within a datacenter.

When more than one separate service application is being supported by nodes 830, nodes 830 may be partitioned into virtual machines (e.g., virtual machine 852 and virtual machine 854). Physical machines can also concurrently run separate service applications. The virtual machines or physical machines can be configured as individualized computing environments that are supported by resources 860 (e.g., hardware resources and software resources) in cloud computing platform 810. It is contemplated that resources can be configured for specific service applications. Further, each service application may be divided into functional portions such that each functional portion is able to run on a separate virtual machine. In cloud computing platform 810, multiple servers may be used to run service applications and perform data storage operations in a cluster. In particular, the servers may perform data operations independently but be exposed as a single device referred to as a cluster. Each server in the cluster can be implemented as a node. Client device 880 may be linked to a service application in cloud computing platform 810. Client device 880 may be any type of computing device, which may correspond to computing device 1000 described with reference to FIG. 10. For example, client device 880 is configured to issue commands to cloud computing platform 810. In embodiments, client device 880 communicates with service applications through a virtual Internet Protocol (IP) and load balancer or other means that direct communication requests to designated endpoints in cloud computing platform 810. The components of cloud computing platform 810 may communicate with each other over a network (not shown), which may include, without limitation, one or more local area networks (LANs) and/or wide area networks (WANs).

With reference to FIG. 9, an example computing device is provided and referred to generally as computing device 900. The computing device 900 is but one example of a suitable computing environment and is not intended to suggest any limitation as to the scope of use or functionality of embodiments of the disclosure, and nor should the computing device 900 be interpreted as having any dependency or requirement relating to any one or combination of components illustrated. Computing device 900 includes bus 910 that directly or indirectly couples the following devices: memory 912, one or more processors 914, one or more presentation components 916, input/output ports 918, input/output components 920, and illustrative power supply 922. Bus 910 represents what may be one or more buses (such as an address bus, data bus, or combination thereof). The various blocks of FIG. 9 are shown with lines for the sake of conceptual clarity, and other arrangements of the described components and/or component functionality are also contemplated. A presentation component, such as a display device, is an example of an I/O component. Also, processors have memory. It is recognized that such is the nature of the art, and it is reiterated that the diagram of FIG. 9 is merely illustrative of an example computing device that can be used in connection with one or more embodiments of the present invention. Distinction is not made between such categories as "workstation," "server," "laptop," "hand-held device," etc., as all are contemplated within the scope of FIG. 9 and with reference to "computing device."

Computing device 900 typically includes a variety of computer-readable media. Computer-readable media can be any available media that can be accessed by computing device 900 and includes both volatile and non-volatile media, removable and non-removable media. By way of example, and not limitation, computer-readable media include computer storage media and communication media. Computer storage media includes volatile and non-volatile, removable and non-removable media implemented in any method or technology for the storage of information, such as computer-readable instructions, data structures, program modules or other data. Computer storage media includes, but is not limited to, RAM, read-only memory (ROM), electronically erasable programmable read-only memory (EEPROM), flash memory or other memory technology, CD-ROM, digital versatile disks (DVDs) or other optical disk storage, magnetic cassettes, magnetic tape, magnetic disk storage or other magnetic storage devices, or any other medium that can be used to store the desired information and which can be accessed by computing device 900. Computer storage media excludes signals per se. Communication media typically embodies computer-readable instructions, data structures, program modules, or other data in a modulated data signal such as a carrier wave or other transport mechanism and includes any information delivery media. The term "modulated data signal" indicates a signal that has one or more of its characteristics set or changed in such a manner so as to encode information in the signal. By way of example, and not limitation, communication media includes wired media such as a wired network or direct-wired connection, and wireless media such as acoustic, radio frequency (RF), infrared and other wireless media. Combinations of any of the above should also be included within the scope of computer-readable media.

Memory 912 includes computer storage media in the form of volatile and/or non-volatile memory. The memory may be removable, non-removable, or a combination thereof. Example hardware devices include solid-state memory, hard drives, optical-disc drives, etc. Computing device 900 includes one or more processors that read data from various entities such as memory 912 or I/O components 920. As used herein, the term processor or "a processor" may refer to more than one computer processor. In one example, the term processor (or "a processor") refers to at least one processor, which may be a physical or virtual processor, such as a computer processor on a virtual machine. The term processor (or "a processor") also may refer to a plurality of processors, each of which may be physical or virtual, such as a multiprocessor system, distributed processing or distributed computing architecture, cloud computing system, or parallel processing by more than a single processor. Further, various operations described herein as being executed or performed by a processor may be performed by more than one processor.

Presentation component(s) 916 present data indications to a user or other device. Example presentation components include a display device, speaker, printing component, vibrating component, etc.

I/O ports 918 allow computing device 900 to be logically coupled to other devices, including I/O components 920, some of which may be built in. Illustrative components include a microphone, joystick, game pad, satellite dish, scanner, printer, wireless device, etc.

Additional Structural and Functional Features of Embodiments of the Technical Solution Having identified various components utilized herein, it should be understood that any number of components and arrangements may be employed to achieve the desired functionality within the scope of the present disclosure. For example, the components in the embodiments depicted in the figures are shown with lines for the sake of conceptual clarity. Other arrangements of these and other components may also be implemented. For example, although some components are depicted as single components, many of the elements described herein may be implemented as discrete or distributed components or in conjunction with other components, and in any suitable combination and location. Some elements may be omitted altogether. Moreover, various functions described herein as being performed by one or more entities may be carried out by hardware, firmware, and/or software, as described herein. For instance, various functions may be carried out by a processor executing instructions stored in memory. As such, other arrangements and elements (e.g., machines, interfaces, functions, orders, and groupings of functions) can be used in addition to or instead of those shown.

Embodiments described herein may be combined with one or more of the specifically described alternatives. In particular, an embodiment that is claimed may contain a reference, in the alternative, to more than one other embodiment. The embodiment that is claimed may specify a further limitation of the subject matter claimed.

The subject matter of embodiments of the invention is described with specificity herein to meet statutory requirements. However, the description itself is not intended to limit the scope of this patent. Rather, the inventors have contemplated that the claimed subject matter might also be embodied in other ways to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

For purposes of this disclosure, the word "including" has the same broad meaning as the word "comprising," and the word "accessing" comprises "receiving," "referencing," or "retrieving." Further, the word "communicating" has the same broad meaning as the word "receiving" or "transmitting" facilitated by software or hardware-based buses, receivers, or transmitters using communication media described herein. In addition, words such as "a" and "an," unless otherwise indicated to the contrary, include the plural as well as the singular. Thus, for example, the constraint of "a feature" is satisfied where one or more features are present. Also, the term "or" includes the conjunctive, the disjunctive, and both (a or b thus includes either a or b, as well as a and b).

For purposes of a detailed discussion above, embodiments of the present invention are described with reference to a distributed computing environment; however, the distributed computing environment depicted herein is merely an example. Components can be configured for performing novel aspects of embodiments, where the term "configured for" can refer to "programmed to" perform particular tasks or implement particular abstract data types using code. Further, while embodiments of the present invention generally refer to the technical solution environment and the schematics described herein, it is understood that the techniques described may be extended to other implementation contexts.

As used herein, the terms "application" or "app" may be employed interchangeably to refer to any software-based program, package, or product that is executable via one or more (physical or virtual) computing machines or devices.

An application may be any set of software products that, when executed, provide an end-user with one or more computational and/or data services. In some embodiments, an application may refer to a set of applications that may be executed together to provide the one or more computational and/or data services. The applications included in a set of applications may be executed serially, in parallel, or any combination thereof. The execution of multiple applications (comprising a single application) may be interleaved. For example, an application may include a first application and a second application. An execution of the application may include the serial execution of the first and second applications or a parallel execution of the first and second applications. In other embodiments, the execution of the first and second applications may be interleaved.

Embodiments of the present invention have been described in relation to particular embodiments which are intended in all respects to be illustrative rather than restrictive. Alternative embodiments will become apparent to those of ordinary skill in the art to which the present invention pertains without departing from its scope.

From the foregoing, it will be seen that this invention is one well-adapted to attain all the ends and objects hereinabove set forth together with other advantages which are obvious and which are inherent to the structure.

It will be understood that certain features and subcombinations are of utility and may be employed without reference to other features or subcombinations. This is contemplated by and is within the scope of the claims.

What is claimed is:

1. A computerized system, comprising:
a computer memory assembly comprising:
a first memory cell; and
a second memory cell directly and sequentially linked to the first memory cell, the first memory cell comprising a first special address location referencing a location of the second memory cell and metadata of the second memory cell, wherein the first special address location is readable by a processor configured to perform operations comprising:
establishing communication with the computer memory assembly;
subsequent to establishing the communication, determining that at least a portion of the second memory cell is inaccessible;
accessing, from the first memory cell, the first special address location referencing the location of the second memory cell and the metadata of the second memory cell;
based on the location of the second memory cell and the metadata of the second memory cell, determining lost data that was stored in the second memory cell by at least:
generating, based on the first special address location, a generator matrix and a parity check matrix;
constructing a pseudo-inverse matrix based on the generator matrix and the parity check matrix; and
determining parity bits based on at least one of the pseudo-inverse matrix, the generator matrix, or the parity check matrix; and
causing the lost data determined to have been stored in the second memory cell to be restored by at least using an XOR-based algorithm including erasure codes to generate the lost data based on the parity bits.

2. The computerized system of claim 1, wherein the first special address location comprises a first plurality of logic gates comprising a first AND gate and a first NOT gate that reference the location of the second memory cell and the metadata of the second memory cell.

3. The computerized system of claim 1, wherein the computer memory assembly comprises a third memory cell directly and sequentially linked to the second memory cell.

4. The computerized system of claim 3, the second memory cell comprising a second special address location comprising a second plurality of logic gates comprising a second AND gate and a second NOT gate that reference a location of the third memory cell and metadata of the third memory cell.

5. The computerized system of claim 3, wherein the first memory cell and the third memory cell are indirectly coupled to each other by way of the second memory cell.

6. The computerized system of claim 4, wherein the first and second special address locations form a chain connection sequentially relating the second memory cell to the first memory cell and the third memory cell to the second memory cell, respectively.

7. The computerized system of claim 1, wherein the second memory cell does not store a special address location referencing information about the first memory cell.

8. The computerized system of claim 1, further comprising:
a computing system comprising the processor and an input/output port, wherein the computer memory assembly is external to the computing system and configured to communicatively couple to the processor of the computing system via the input/output port.

9. The computerized system of claim 1, wherein determining the lost data that was stored in the second memory cell comprises:
generating, based on the first special address location, a generator matrix and a parity check matrix;
simulating scatter sector loss and reconstruction based on the generator matrix and the parity check matrix;
constructing a pseudo-inverse matrix based on the generator matrix and the parity check matrix; and
determining parity bits based on at least one of the pseudo-inverse matrix, the generator matrix, or the parity check matrix, wherein the lost data determined to have been stored in the second memory cell is recovered based on the parity bits, wherein restoring the lost data comprises adding the parity bits determined to be stored in the second memory cell.

10. The computerized system of claim 1, wherein the second memory cell comprises a sensor that detects telemetry data comprising at least one of temperature data or power data, wherein at least one operation of the operations is performed in response to the processor receiving an indication of the telemetry data deviating from a target range.

11. The computerized system of claim 1, wherein determining the lost data that was stored in the second memory cell comprises:
performing a reverse incremental construction; and
based at least on the reverse incremental construction, determining parity bits determined to be stored in the second memory cell, wherein the parity bits are added based on the reverse incremental construction.

12. A computer-implemented method, comprising:
establishing communication with a computer memory assembly comprising (1) a first memory cell and (2) a second memory cell that is directly and sequentially linked to the first memory cell, the first memory cell comprising a first special address location referencing a location of the second memory cell and metadata of the second memory cell;

subsequent to establishing the communication, determining that at least a portion of the second memory cell is inaccessible;

accessing, from the first memory cell, the first special address location referencing the location of the second memory cell and the metadata of the second memory cell;

based on the location of the second memory cell and the metadata of the second memory cell referenced by the first special address location, determining lost data that was stored in the second memory cell by at least:

generating, based on the first special address location, a generator matrix and a parity check matrix;

constructing a pseudo-inverse matrix based on the generator matrix and the parity check matrix; and determining parity bits based on at least one of the pseudo-inverse matrix, the generator matrix, or the parity check matrix; and initiating a recovery operation restoring the lost data determined to have been stored in the second memory cell by at least using an XOR-based algorithm including erasure codes to generate the lost data based on the parity bits.

13. The computer-implemented method of claim 12, wherein the first special address location comprises a first plurality of logic gates comprising a first AND gate and a first NOT gate that reference the location of the second memory cell and the metadata of the second memory cell, wherein a first size associated with the metadata is less than a second size associated with the most significant bits a of a cache tag.

14. The computer-implemented method of claim 12, wherein the lost data is determined and restored without reading data from a backup storage of a datacenter storing at least a portion of similar data to that stored in the second memory cell.

15. The computer-implemented method of claim 12, wherein determining the lost data that was stored in the second memory cell comprises:

performing a reverse incremental construction; and based at least on the reverse incremental construction, determining parity bits determined to be stored in the second memory cell, wherein the parity bits are added based on the reverse incremental construction.

16. The computer-implemented method of claim 12, wherein the recovery operation comprises writing, to the computer memory assembly, the lost data determined to have been stored in the second memory cell.

17. The computer-implemented method of claim 12, wherein the at least a portion of the second memory cell is inaccessible due to at least one of: damage to the second memory cell, inability to communicate with the second memory cell, the second memory cell not having been deleted in response to an input to delete content corresponding to the lost data, or telemetry information for the second memory cell being outside a normal range.

18. One or more computer storage media having computer-executable instructions embodied thereon that, when executed by a computing system having at least one processor and at least one memory, cause the at least one processor to perform operations comprising:

establishing communication with a computer memory assembly comprising (1) a first memory cell and (2) a second memory cell that is directly and sequentially linked to the first memory cell, the first memory cell comprising a first special address location referencing a location of the second memory cell and metadata of the second memory cell;

subsequent to establishing the communication, determining that at least a portion of the second memory cell is inaccessible;

accessing, from the first memory cell, the first special address location referencing the location of the second memory cell and the metadata of the second memory cell;

based on the location of the second memory cell and the metadata of the second memory cell referenced by the first special address location, determining lost data that was stored in the second memory cell by at least:

generating, based on the first special address location, a generator matrix and a parity check matrix;

constructing a pseudo-inverse matrix based on the generator matrix and the parity check matrix; and determining parity bits based on at least one of the pseudo-inverse matrix, the generator matrix, or the parity check matrix; and performing a recovery operation restoring the lost data determined to have been stored in the second memory cell based on an erasure encoding associated with the lost data based on the parity bits.

19. The one or more computer storage media of claim 18, wherein the recovery operation comprises writing, to the computer memory assembly, the lost data determined to have been stored in the second memory cell, wherein the lost data is written without reading from a backup storage of a datacenter that stores a copy of data stored in the computer memory assembly.

20. The one or more computer storage media of claim 18, wherein determining the lost data that was stored in the second memory cell comprises:

generating, based on the first special address location, a generator matrix and a parity check matrix;

simulating scatter sector loss and reconstruction based on the generator matrix and the parity check matrix;

constructing a pseudo-inverse matrix based on the generator matrix and the parity check matrix; and determining parity bits based on at least one of the pseudo-inverse matrix, the generator matrix, or the parity check matrix, wherein the lost data determined to have been stored in the second memory cell is recovered based on the parity bits.

* * * * *